United States Patent
Choi et al.

(10) Patent No.: US 11,600,495 B2
(45) Date of Patent: Mar. 7, 2023

(54) METHOD OF MANUFACTURING SEMICONDUCTOR DEVICE

(71) Applicant: Samsung Electronics Co., Ltd., Suwon-si (KR)

(72) Inventors: Yoon Young Choi, Seoul (KR); Dong Kyun Lee, Seoul (KR); Sang Oh Lee, Suwon-si (KR); Sang Jae Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 267 days.

(21) Appl. No.: 17/029,215

(22) Filed: Sep. 23, 2020

(65) Prior Publication Data

US 2021/0272817 A1    Sep. 2, 2021

(30) Foreign Application Priority Data

Mar. 2, 2020    (KR) ........................ 10-2020-0026023

(51) Int. Cl.
*H01L 21/311* (2006.01)
*H01L 21/033* (2006.01)
*H01L 49/02* (2006.01)

(52) U.S. Cl.
CPC .... *H01L 21/31144* (2013.01); *H01L 21/0337* (2013.01); *H01L 28/60* (2013.01)

(58) Field of Classification Search
CPC .............. H01L 28/60; H01L 27/10894; H01L 27/10847; H01L 21/0276; H01L 21/31116; H01L 27/1085
See application file for complete search history.

(56) References Cited

U.S. PATENT DOCUMENTS

| | | | |
|---|---|---|---|
| 7,727,837 B2 | 6/2010 | Gruening-Von et al. | |
| 8,247,856 B2 | 8/2012 | Kim et al. | |
| 8,580,648 B2 | 11/2013 | Choi et al. | |
| 9,230,793 B2 | 1/2016 | Sung | |
| 9,659,940 B2 | 5/2017 | Park et al. | |
| 9,935,111 B2 | 4/2018 | Kim et al. | |
| 10,347,641 B2 | 7/2019 | Kim et al. | |
| 2017/0098653 A1 | 4/2017 | Koh et al. | |
| 2021/0134810 A1* | 5/2021 | Lin | H01L 21/02164 |

* cited by examiner

*Primary Examiner* — Walter H Swanson
(74) *Attorney, Agent, or Firm* — Myers Bigel, P.A.

(57) ABSTRACT

Provided is a method of manufacturing a semiconductor device. The method includes providing a substrate in which a main area including a first cell area and a first peripheral area, and an edge area including a second cell area and a second peripheral area are defined, sequentially forming a mold layer, a supporter layer, a mask layer, and a preliminary pattern layer on the substrate, exposing the preliminary pattern layer to light to simultaneously form a first pattern and a second pattern on the mask layer of the first cell area and the second cell area, respectively, forming an etch stop layer on the second pattern and etching the mask layer using the etch stop layer and the first pattern to form a hole pattern in the mold layer and the supporter layer of the first cell area.

20 Claims, 23 Drawing Sheets

METHOD OF MANUFACTURING SEMICONDUCTOR DEVICE

CROSS-REFERENCE TO RELATED APPLICATION

This application claims priority from Korean Patent Application No. 10-2020-0026023 filed on Mar. 2, 2020 in the Korean Intellectual Property Office, and all the benefits accruing therefrom under 35 U.S.C. 119, the contents of which in its entirety are herein incorporated by reference.

BACKGROUND

1. Technical Field

The present disclosure relates to methods of manufacturing a semiconductor device.

2. Description of the Related Art

Semiconductor devices have been developed to enable high-speed operation at low voltages, and manufacturing processes of semiconductor devices have been developed to improve integration density. Therefore, highly scaled patterns may be spaced apart at a fine pitch with a fine width in highly integrated semiconductor devices.

In some highly integrated devices, patterning beyond the application range of double patterning (DPT) may be necessary, and an extreme ultraviolet (EUV) lithography technology has been introduced to address this need. If a manufacturer follows a process sequence used in the DPT while using the EUV lithography technology, reliability of a semiconductor device may be decreased or process steps may be increased.

SUMMARY

Aspects of the present disclosure provide a semiconductor device manufacturing method that simplifies a process while increasing an integration density of a semiconductor device.

Aspects of the present disclosure also provide a semiconductor device manufacturing method that improves reliability of an apparatus including a semiconductor device while increasing an integration density of the semiconductor device.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a method of manufacturing a semiconductor device, comprising providing a substrate in which a main area including a first cell area and a first peripheral area, and an edge area including a second cell area and a second peripheral area are defined, sequentially forming a mold layer, a supporter layer, a mask layer and a preliminary pattern layer on the substrate, exposing the preliminary pattern layer to light to simultaneously form a first pattern and a second pattern on the mask layer of the first cell area and the second cell area, respectively, forming an etch stop layer on the second pattern and etching the mask layer using the etch stop layer and the first pattern to form a hole pattern in the mold layer and the supporter layer of the first cell area.

According to an aspect of the present disclosure, there is provided a method of manufacturing a semiconductor device, comprising providing a substrate in which a main area including a first cell area and a first peripheral area, and an edge area including a second cell area and a second peripheral area are defined, sequentially forming a mold layer, a supporter layer, a mask layer, an anti-reflective coating layer, and a preliminary pattern layer on the substrate, exposing the preliminary pattern layer to light to form a first pattern and a second pattern on the anti-reflective coating layer of the first cell area and the second cell area, respectively, forming an etch stop layer on the second pattern, the etch stop layer not being formed on the main area and etching the mask layer using the etch stop layer and the first pattern to form a hole pattern in the mold layer and the supporter layer of the first cell area.

According to an aspect of the present disclosure, there is provided a method of manufacturing a semiconductor device, comprising providing a substrate in which a main area including a first cell area and a first peripheral area, and an edge area including a second cell area and a second peripheral area are defined, sequentially forming a mold layer, a supporter layer, a mask layer, an anti-reflective coating layer, and a preliminary pattern layer on the substrate, exposing the preliminary pattern layer to light to simultaneously form a first pattern and a second pattern on the anti-reflective coating layer of the first cell area and the second cell area, respectively, forming an etch stop layer on the second pattern, the etch stop layer not being formed on the main area, forming a hole pattern in the first cell area using the etch stop layer and the first pattern to extend through the mold layer, the supporter layer and the mask layer, the hole pattern not being formed on the first peripheral area, the second cell area and the second peripheral area, forming a lower electrode in the hole pattern, exposing an upper surface of the supporter layer such that upper ends of the supporter layer on the first cell area, an upper end of the supporter layer on the first peripheral area, an upper end of the supporter layer on the second cell area, and an upper end of the supporter layer on the second peripheral area are at substantially a same level, forming a supporter mask layer on the supporter layer, patterning the supporter mask layer to form a supporter mask pattern, forming a supporter opening using the supporter mask pattern to extend through the supporter layer, removing the mold layer, forming a capacitor dielectric layer on the lower electrode, forming an upper electrode on the capacitor dielectric layer, forming an interlayer insulating layer on the upper electrode and planarizing the interlayer insulating layer.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE EMBODIMENTS

Figure 1:
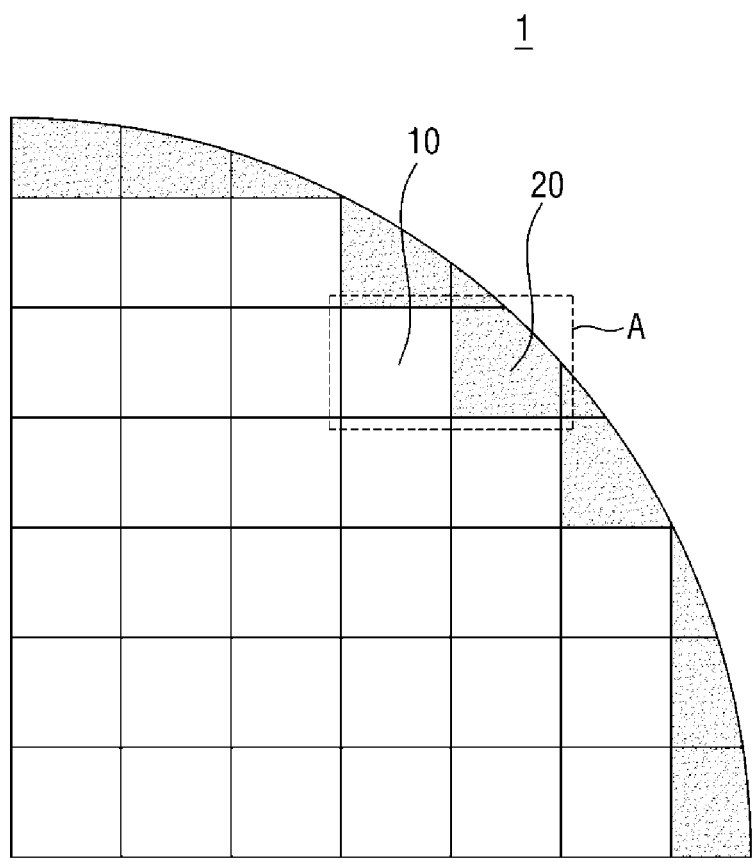
FIG. 1 is a plan view showing a portion of a wafer according to some embodiments of the present inventive concept.

Hereinafter, example embodiments of the present disclosure will be described in detail with reference to the accompanying drawings. In the drawings, the same components are denoted by the same reference numerals, and a redundant description thereof will be omitted. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Figure 2:
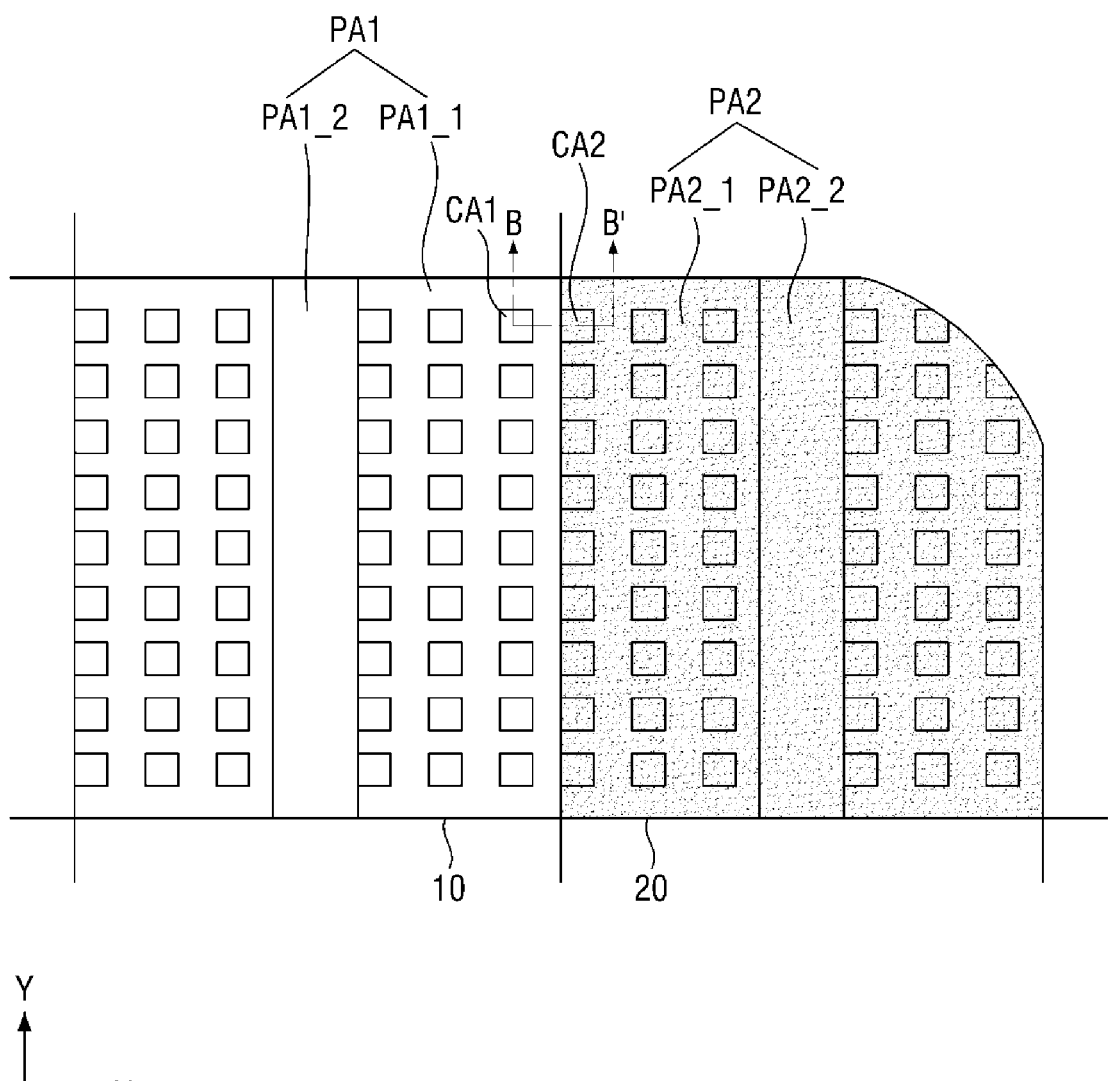
FIG. 2 is an enlarged view of area A in FIG. 1, and is a cross-sectional view showing a layout in a main area and an edge area.

FIG. 1 is a plan view showing a portion of a wafer according to some embodiments of the present inventive concept. FIG. 2 is an enlarged view of area A in FIG. 1, and is a cross-sectional view showing a layout in a main area and an edge area.

Referring to FIGS. 1 and 2, a wafer 1 may include a plurality of chip regions 10 and a plurality of edge regions 20 positioned to border or surround the plurality of chip regions 10 at an edge of the wafer 1.

Each of the plurality of chip regions 10 may include a first cell area CA1 and a first peripheral area PA1. The first peripheral area PA1 may include a first core area PA1_1 and a first peri area PA1_2.

Each of the plurality of edge regions 20 may include a second cell area CA2 and a second peripheral area PA2. The second peripheral area PA2 may include a second core area PA2_1 and a second peri area PA2_2.

Specific shapes, layouts, and arrangements of the cell areas CA1 and CA2 and the peripheral areas PA1 and PA2 shown in FIG. 2 are merely examples, and various modifications are possible within the scope of the technical spirit of various embodiments of the inventive concept.

Figure 3:
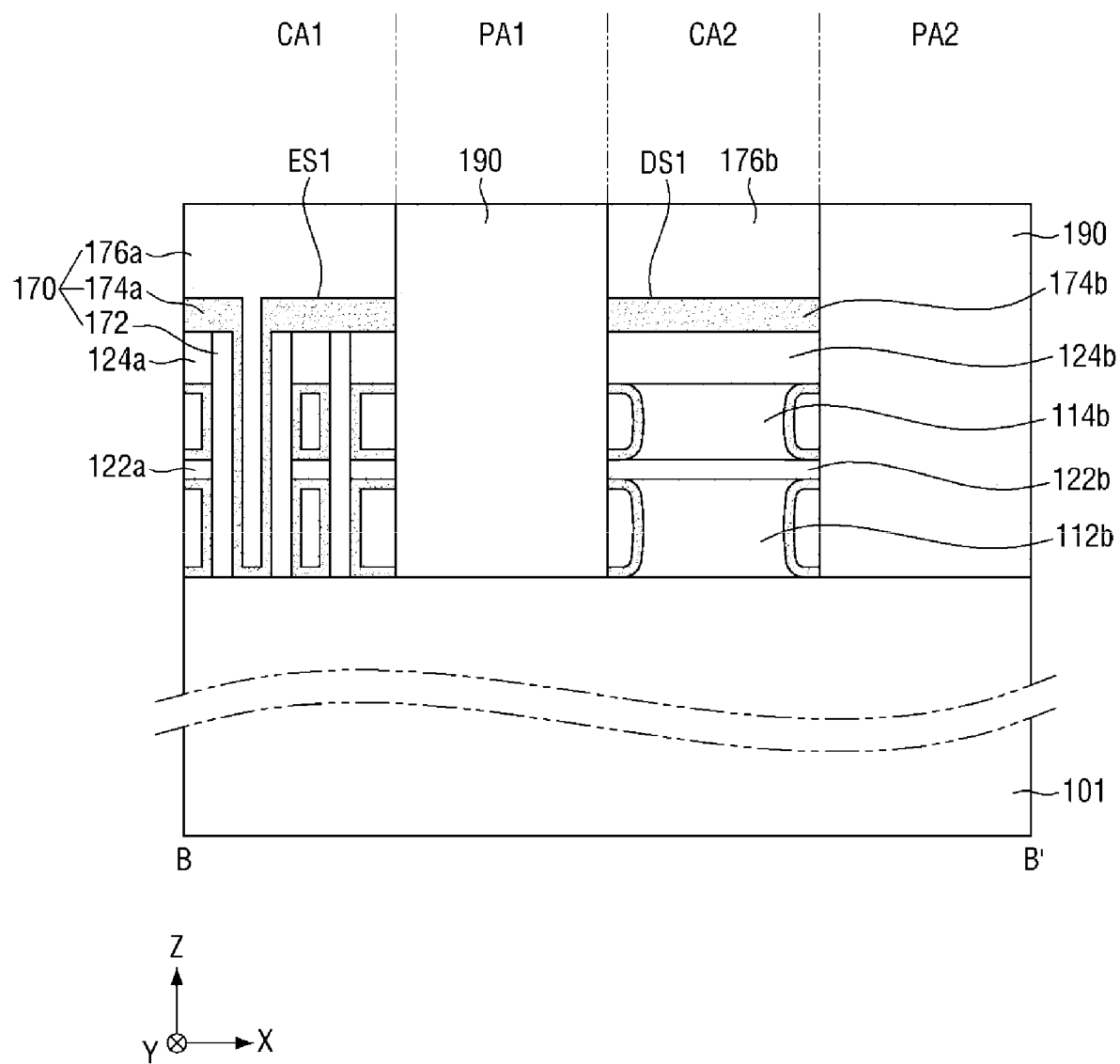
FIG. 3 is a cross-sectional view taken along line B-B' of FIG. 2.

FIG. 3 is a cross-sectional view taken along line B-B' of FIG. 2.

FIG. 3 shows a cross-sectional view of each of the first cell area CA1, the first peripheral area PA1, the second cell area CA2, and the second peripheral area PA2 of FIG. 2.

Referring to FIG. 3, a semiconductor device 100 may include a lower structure 101 formed in the cell areas CA1 and CA2 and the peripheral areas PA1 and PA2.

Although not shown, the lower structure 101 may include a base substrate, an active region formed on the base substrate, an element isolation film defining the active region, a source/drain region, a word line, a bit line, a contact region, and the like.

Further, unit elements (not shown), such as various types of active elements or passive elements, used for forming the semiconductor device, and an interlayer insulating film (not shown) on and at least partially covering the unit elements may be formed in the lower structure 101. The unit elements may be, for example, cell transistors, such as a dynamic random access memory (DRAM) or a flash memory. The cell transistors may be, for example, DRAM memory cell transistors having a unit cell size of 6F2 or 4F2, but embodiments of the inventive concept are not limited thereto.

The base substrate may include silicon (Si), for example, crystalline Si, polycrystalline Si, or amorphous Si. In some other embodiments, the base substrate may include a semiconductor, such as germanium (Ge), or a compound semiconductor such as silicon germanium (SiGe), silicon carbide (SiC), gallium arsenide (GaAs), indium arsenide (InAs), or indium phosphide (InP).

The contact region may connect a capacitor 170 to the source/drain region formed on the base substrate. The contact region may be formed of, e.g., polysilicon.

In the cell areas in each of the plurality of chip regions 10 (see FIG. 2), that is, in the first cell area CA1, a lower electrode structure ES1 composed of lower electrodes 172 and first and second supporters 122a and 124a, a gate dielectric film 174a on and at least partially covering the lower electrode structure ES1, and an upper electrode 176a may be formed on the lower structure 101. The lower electrodes 172, the dielectric film 174a, and the upper electrode 176a may constitute the capacitor 170.

In some embodiments, each of the lower electrodes 172 may be connected to the contact region (not shown) formed in the lower structure 101. The lower electrodes 172 in this embodiment are shown in a pillar shape, but embodiments of the inventive concept are not limited thereto. For example, the lower electrodes 172 may have a cylinder shape, but embodiments of the present inventive concept are not limited thereto.

The dielectric film 174a may be formed to be on and at least partially cover the lower electrodes 172 and the supporters 122a and 124a. In some embodiments, the dielectric film 174a may include silicon oxide or a high-dielectric constant (high-k) material. In some other embodiments, the dielectric film 174a may include, for example, a composite layer having a dual structure of a silicon oxide layer and a silicon nitride layer, or a silicon oxide layer whose surface is nitrided. The high-k material may include, for example, at least one or a combination of materials including, but not limited to, aluminum oxide (AlOx), tantalum oxide (TaxOy), titanium oxide (TiOx), yttrium oxide (YxOy), zirconium oxide (ZrOx), zirconium silicon oxide (ZrSixOy), hafnium oxide (HfOx), hafnium silicon oxide (HfSixOy), lanthanum oxide (LaxOy), lanthanum aluminum oxide (LaAlxOy), lanthanum hafnium oxide (LaHfxOy), hafnium aluminum oxide (HfAlxOy), and praseodymium oxide (PrxOy).

The upper electrode 176a may be formed to be on and at least partially cover the lower electrode structure ES1 composed of the lower electrodes 172a and the supporters 122a and 124a, and the gate dielectric film 174a. The upper electrode 176a may include, for example, one or more of titanium, titanium nitride, tantalum nitride, platinum, tungsten, doped polysilicon, doped silicon germanium, or the like.

In some embodiments, the upper electrode 176a may be made of the same material as the lower electrodes 172, but embodiments of the inventive concept are not limited thereto.

The supporters 122a and 124a may serve to support the lower electrodes 172 formed on the lower structure 101 to prevent or reduce the likelihood of the lower electrodes 172 collapsing. In some embodiments, the supporters 122a and 124a may include a material, such as silicon nitride, tantalum oxide, and/or titanium oxide.

In the cell areas in each of the plurality of edge regions 20 (see FIG. 2), that is, in the second cell area CA2, a dummy structure DS1 in which a first mold film 112b, a first supporter film 122b, a second mold film 114b, and a second supporter film 124b are sequentially stacked may be formed on the lower structure 101. A dielectric film 174b and an upper electrode 176b may be sequentially formed on the second supporter film 124b of the dummy structure DS1. The dielectric film 174b and the upper electrode 176b may be made of the same material as the dielectric film 174a and the upper electrode 176a formed in the first cell area CA1, respectively.

The first supporter 122a of the first cell area CA1 and the first supporter film 122b of the second cell area CA2 may be formed by patterning a first supporter layer 122 to be described below with reference to FIG. 4. In addition, the second supporter 124a of the first cell area CA1 and the second supporter film 124b of the second cell area CA2 may be formed by patterning a second supporter layer 124 to be described below with reference to FIG. 4.

Accordingly, the first supporter film 122b and the second supporter film 124b may be positioned at substantially the same level as the first supporter 122a and the second supporter 124a formed in the first cell area CA1, respectively. In addition, the first supporter film 122b and the second supporter film 124b may be made of the same material as the first supporter 122a and the second supporter 124a formed in the first cell area CA1, respectively.

The first mold film 112b and the second mold film 114b may be formed of materials having different etching selectivity from the supporter films 122b and 124b. For example, when the supporter films 122b and 124b are made of silicon nitride, the mold films 112b and 114b may be made of silicon oxide, but embodiments of the inventive concept are not limited thereto.

In some embodiments, as illustrated in FIG. 3, the first mold film 112b and the second mold film 114b may be partially concavely etched, and the gate dielectric film 174a may be coated on sidewalls of the etched first mold film 112b and second mold film 114b, and the upper electrode 176a may be on and at least partially cover the gate dielectric film 174a on the sidewalls. However, embodiments of the present inventive concept are not limited thereto. As an example, the sidewalls of the first mold film 112b and the second mold film 114b may be aligned with a sidewall of the first supporter film 122b of the second cell area CA2.

An interlayer insulating film 190 may be formed on the lower structure 101 in each of the peripheral areas, i.e., the first peripheral area PA1 and the second peripheral area PA2 in each of the plurality of chip regions 10 (see FIG. 2) and each of the plurality of edge regions 20 (see FIG. 2). The interlayer insulating film 190 may include, for example, silicon oxide, but embodiments are not limited thereto.

FIGS. 4 to 19 are diagrams illustrating intermediate steps of a method of manufacturing a semiconductor device according to some embodiments of the inventive concept. FIGS. 4 to 19 are cross-sectional views illustrated according to a process sequence, and show cross-section B-B' of FIG. 2 according to the process sequence.

Figure 4:
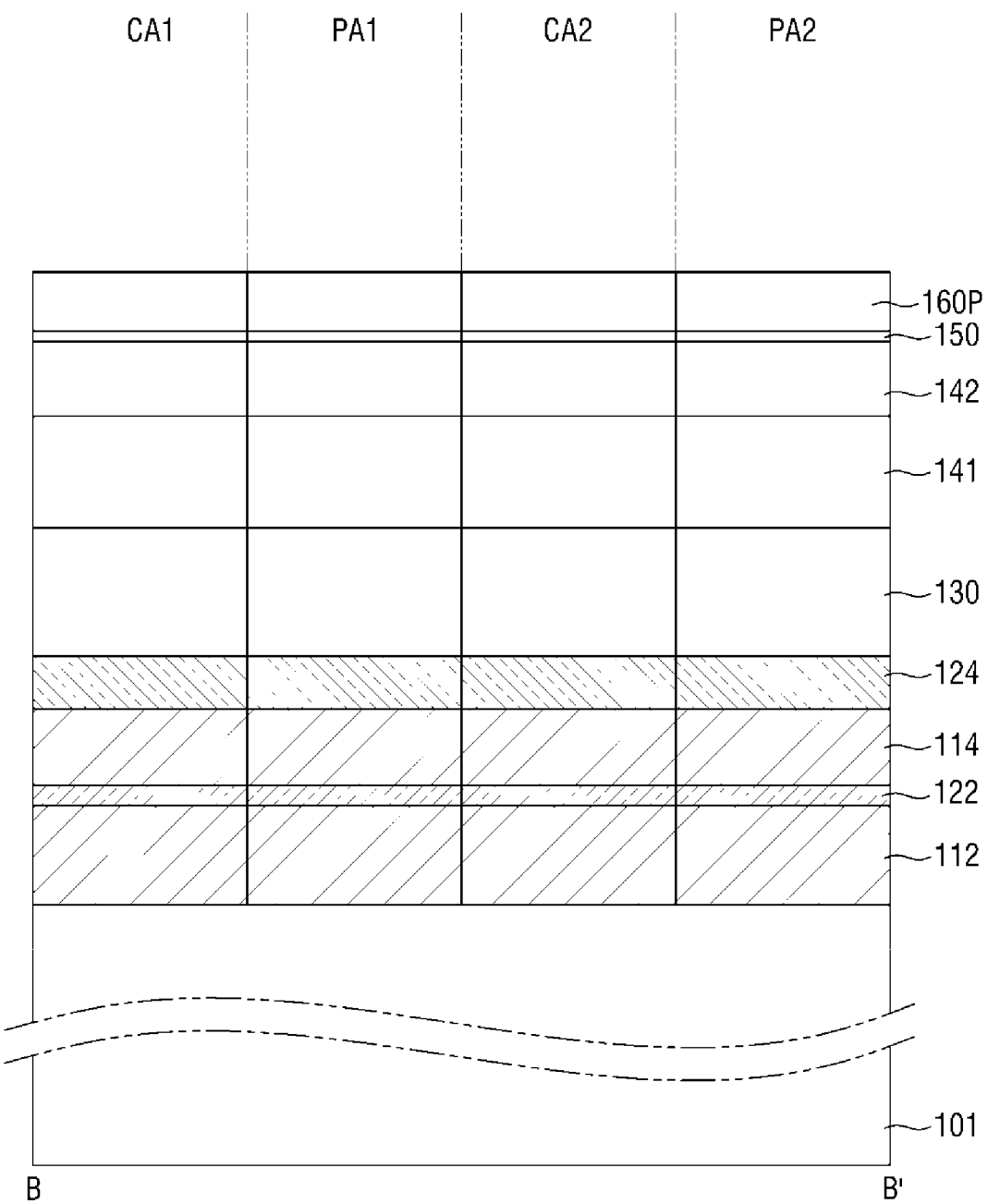
FIGS. 4 to 19 are diagrams illustrating intermediate steps of a method of manufacturing a semiconductor device according to some embodiments of the present inventive concept.

Referring to FIG. 4, a first mold layer 112 and a first supporter layer 122, a second mold layer 114, a second supporter layer 124, a carbon-containing layer 130, a first mask layer 141, a second mask layer 142, an anti-reflective coating layer 150, and a preliminary pattern layer 160P may be sequentially formed on the lower structure 101 in the first and second cell areas CA1 and CA2 and the first and second peripheral areas PA1 and PA2.

The first mold layer 112, the first supporter layer 122, the second mold layer 114, the second supporter layer 124, the carbon-containing layer 130, the first mask layer 141, the second mask layer 142, the anti-reflective coating layer 150, and the preliminary pattern layer 160P each may be formed by, for example, a physical vapor deposition (PVD) process, a chemical vapor deposition (CVD) process, an atomic layer deposition (ALD) process, a spin coating process, or the like.

The first mold layer 112 and the second mold layer 114 may serve as a sacrificial film for forming the lower electrodes 172 (see FIG. 3) by a subsequent process. In some embodiments, the first mold layer 112 and the second mold layer 114 may include, for example, silicon oxide.

The first supporter layer 122 and the second supporter layer 124 may be material layers respectively for forming the first supporter 122a (see FIG. 3) and the second supporter 124a (see FIG. 3) that support the lower electrodes 172 (see FIG. 3). In some embodiments, the first supporter layer 122 and the second supporter layer 124 may be formed of materials having different etching selectivity from the first mold layer 112 and the second mold layer 114. For example, when the first mold layer 112 and the second mold layer 114 are made of silicon oxide, the first supporter layer 122 and the second supporter layer 124 may be made of silicon nitride. However, embodiments are not limited thereto.

The carbon-containing layer 130 is, for example, an amorphous carbon layer (ACL). The carbon-containing layer 130 according to some embodiments of the inventive concept may be formed as a single plane before the first mask layer 141, the second mask layer 142, the anti-reflective coating layer 150, and the preliminary pattern layer 160P are stacked. That is, the carbon-containing layer 130 may be planarized so as to have a substantially uniform height (in the Z direction) relative to the lower structure 101 across the different areas CAL PA1, CA2, and PA2. In addition, a carbon-containing layer pattern 130P may be formed to be used as an etching mask pattern.

Figure 8:
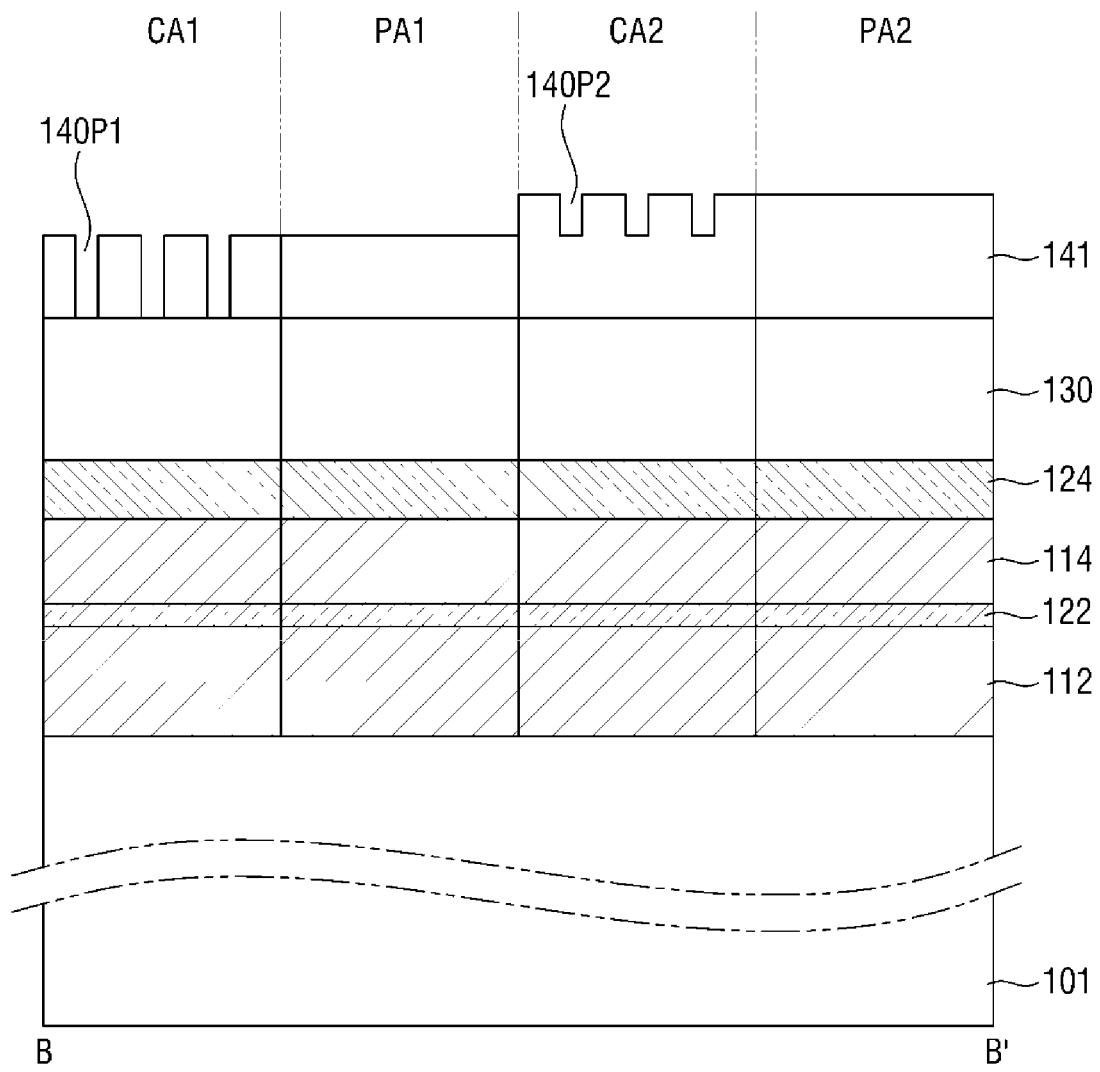

The first mask layer 141 and the second mask layer 142 may be material layers for forming a first preliminary hole pattern 140P1 (see FIG. 8) and a second preliminary hole pattern 140P2 (see FIG. 8). Each of the first mask layer 141 and the second mask layer 142 may be formed of a material having a different etching selectivity from each other.

In some embodiments, the first mask layer 141 may include silicon oxide, and the second mask layer 142 may include a spin-on hardmask (SOH). However, embodiments are not limited thereto.

The anti-reflective coating layer (ARC layer) 150 may be formed on the second mask layer 142. The ARC layer 150 may include silicon nitride or silicon oxynitride. For example, the ARC layer 150 may be silicon oxynitride. The ARC layer 150 may be thinner than the preliminary pattern layer 160P to be described below.

The ARC layer 150 may reduce or prevent diffused reflection when the preliminary pattern layer 160P is exposed, and thus, may be used for performing a photolithography process.

The preliminary pattern layer 160P is a material layer for forming a first pattern P1 and a second pattern P2. Although illustrated as a single layer, the preliminary pattern layer 160P may include a plurality of material layers according to some embodiments. The preliminary pattern layer 160P may include a photoresist. According to some embodiments, the preliminary pattern layer 160P may include a carbon compound.

Figure 5:
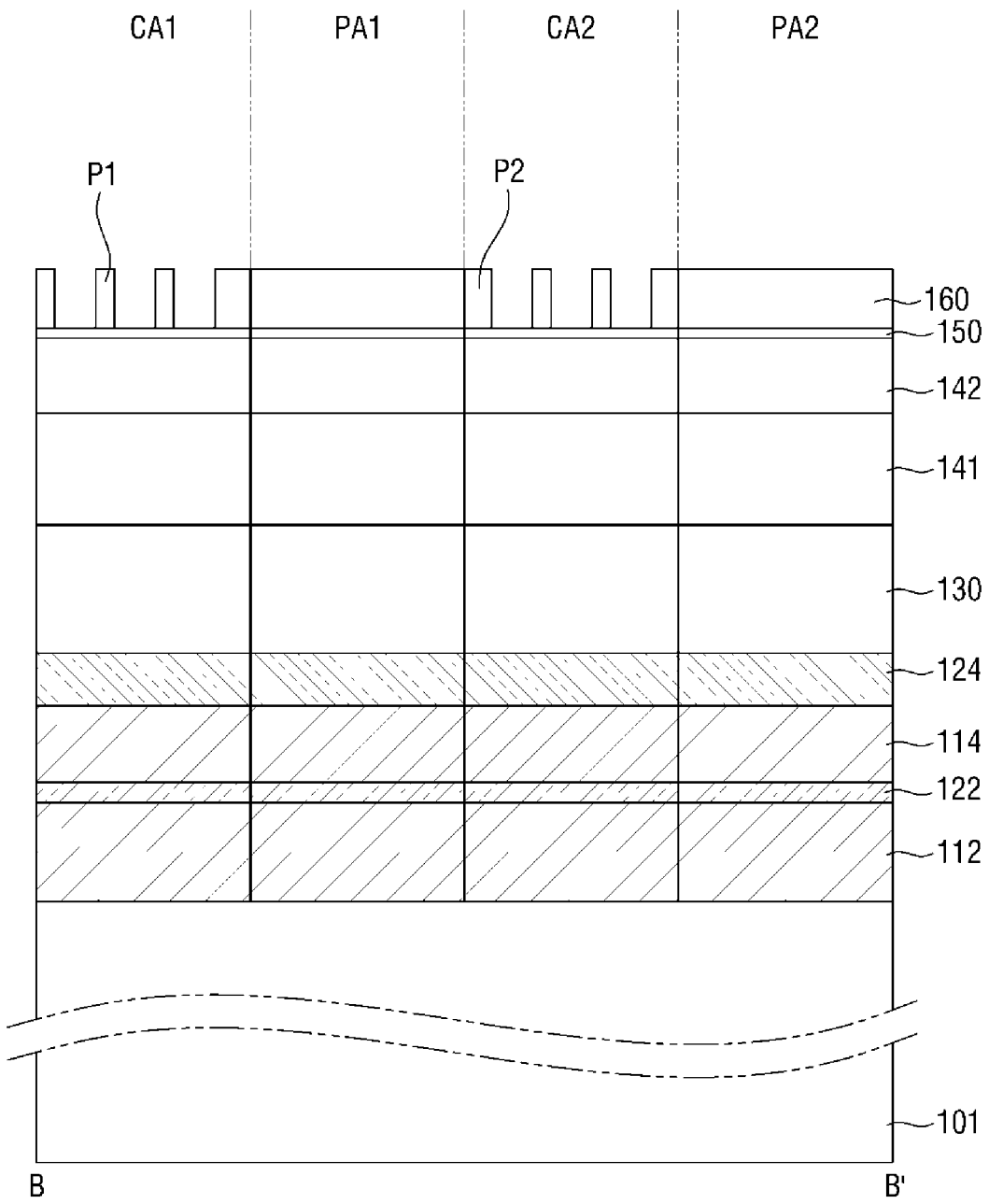

Referring to FIG. 5, the preliminary pattern layer 160P may be exposed to form a pattern layer 160 including the first pattern P1 and the second pattern P2. That is, the pattern layer 160 may be formed using a photolithography process, and the first pattern P1 and the second pattern P2 may be formed simultaneously.

The pattern layer 160 may be on completely cover the first peripheral area PA1 and the second peripheral area PA2 in the Z direction, and partially cover the first cell area CA1 and the second cell area CA2 in the Z direction.

The pattern layer 160 on the first cell area CA1 and the second cell area CA2 may have a shape of lines parallel to each other or a shape of bars parallel to each other in a plan view. The first pattern P1 and the second pattern P2 may be disposed on the first cell area CA1 and the second cell area CA2, respectively.

A height in the Z direction between the base substrate and the highest point of the first pattern P1 is the same as a height in the Z direction between the base substrate and the highest point of the second pattern P2. The ARC layer 150 may be located at bottom surfaces of the first pattern P1 and the second pattern P2, and may be partially exposed between portions of the pattern layer 160.

Extreme ultraviolet (EUV) light may be used to expose the preliminary pattern layer 160P, and accordingly, the first pattern P1 and the second pattern P2 may be simultaneously formed. Embodiments of the present inventive concept are not limited thereto, and may include, for example, light from a light source such as ArF, KrF, and an electron beam.

Figure 6:
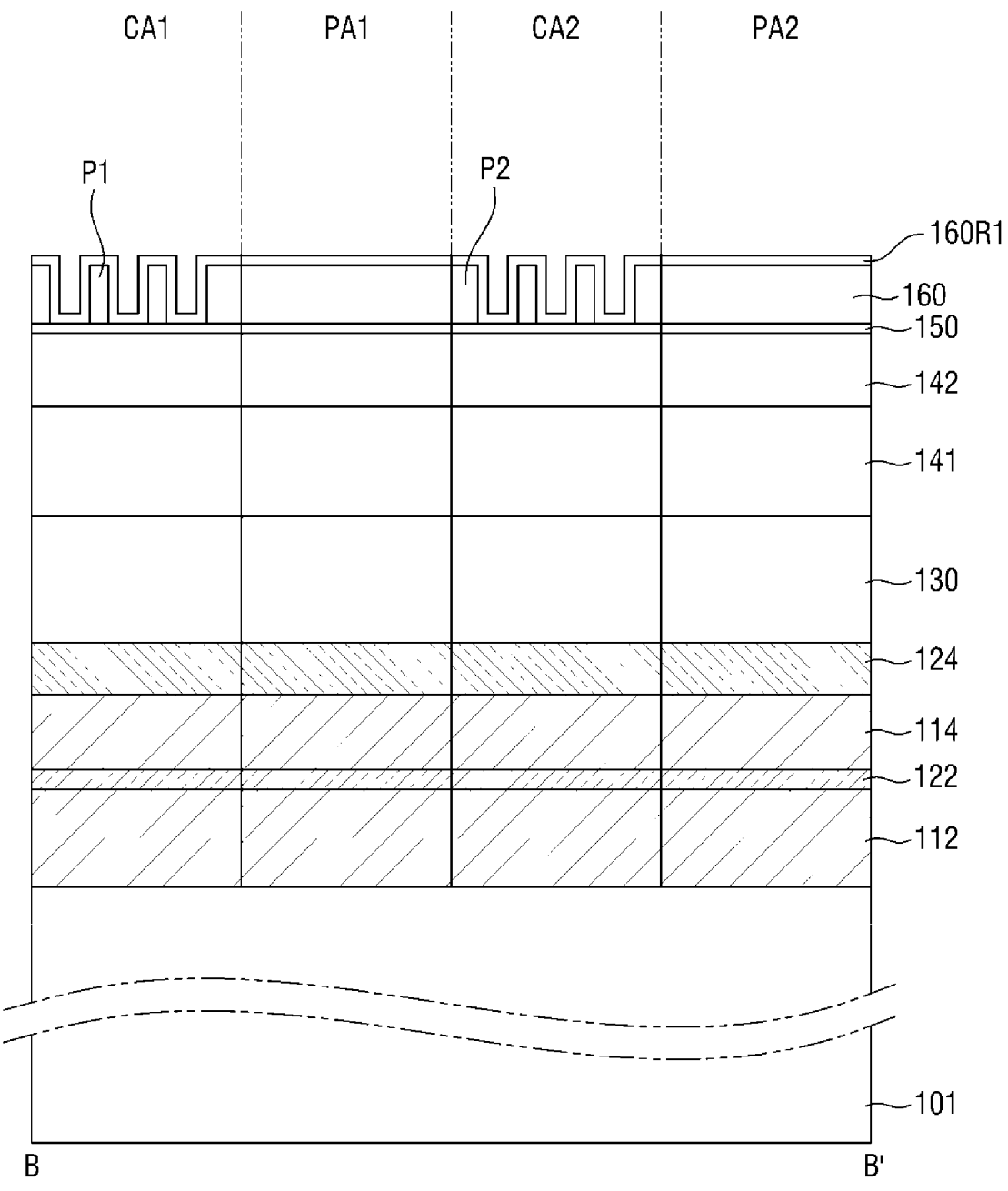

Referring to FIG. 6, a first rework layer 160R1 may be formed on the pattern layer 160 in the first cell area CAL the first peripheral area PA1, the second cell area CA2, and the second peripheral area PA2.

The first rework layer 160R1 may be, for example, a silicon oxynitride layer. The first rework layer 160R1 may be a material having a different etching selectivity from the pattern layer 160 and a first etch stop layer 161_1 to be described below with reference to FIG. 7. If the first etch stop layer 161_1 is, for example, disposed on the first cell area CA1 or not disposed on the second cell area CA2, it may be removed.

The first rework layer 160R1 may be conformally formed on the pattern layer 160 by an atomic layer deposition (ALD) process, but embodiments of the inventive concept are not limited thereto.

Figure 7:
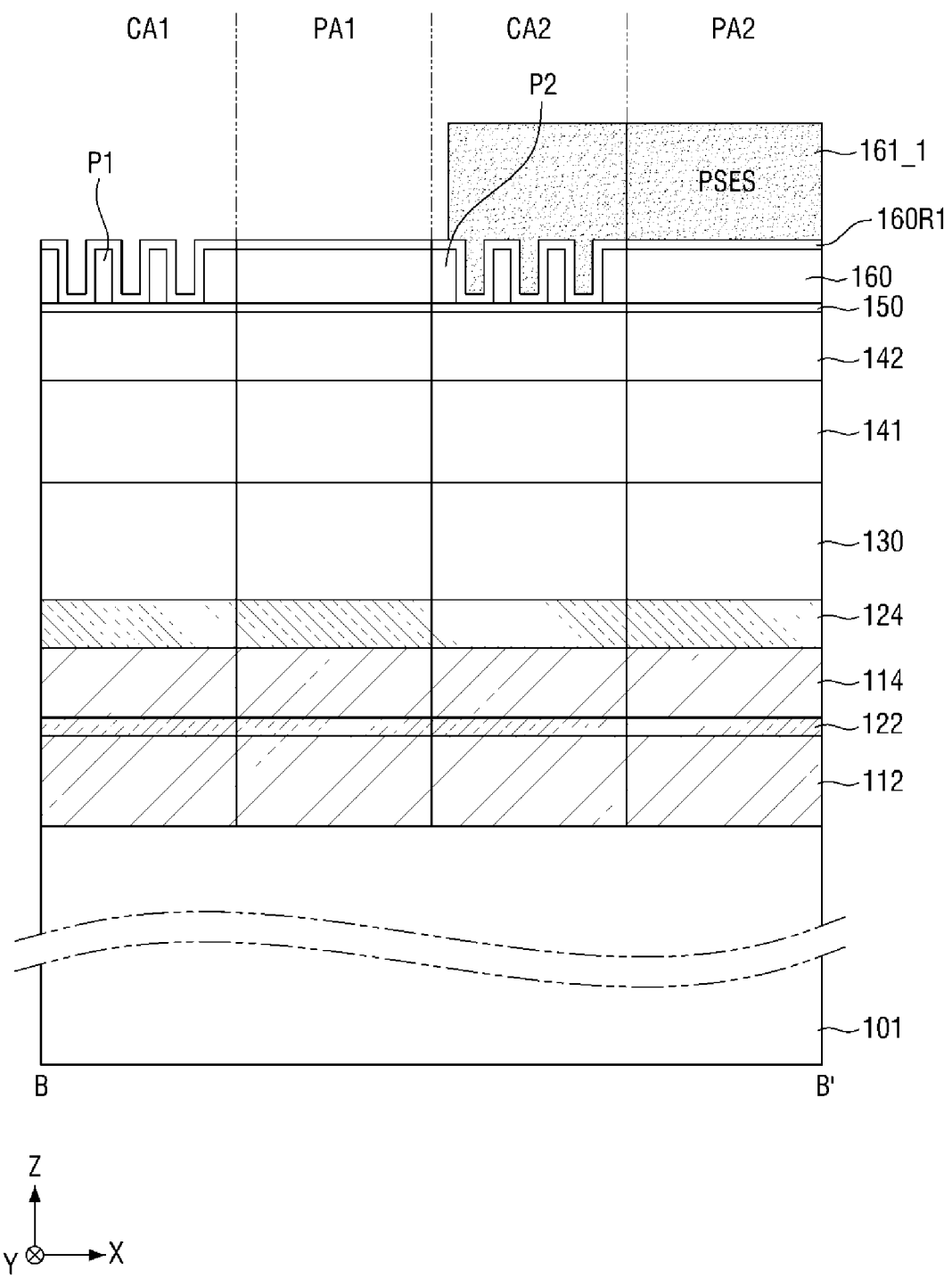

Referring to FIG. 7, the first etch stop layer 161_1 may be formed on the first rework layer 160R1 in the second cell area CA2 and the second peripheral area PA2.

The first etch stop layer 161_1 may include a photo sensitive etch stopping (PSES) mask layer. In some other embodiments, unlike FIG. 7, the first etch stop layer 161_1 may be on and at least partially cover in the Z direction only the second cell area CA2 without being on and at least partially covering the second peripheral area PA2, but embodiments of the inventive concept are not limited thereto.

The first etch stop layer 161_1 may be formed of a material having a different etching selectivity from the pattern layer 160, the ARC layer 150, and the second mask layer 142. The first etch stop layer 161_1 may include, for example, at least one of a carbon compound, silicon oxide, silicon nitride, silicon oxynitride, a metal film, a photoresist, spin-on glass (SOG), and/or a spin-on hardmask (SOH).

Referring to FIG. 8, the first and second mask layers 141 and 142 (see FIG. 7) positioned in the first and second cell areas CA1 and CA2 are etched using the first pattern P1 positioned in the first cell area CA1 and the second pattern P2 positioned in the second cell area CA2 as etching mask patterns, thereby forming the first and second preliminary hole patterns 140P1 and 140P2 serving as mask patterns.

During the process of forming the first and second preliminary hole patterns 140P1 and 140P2, the first etch stop layer 161_1, the pattern layer 160, the ARC layer 150 and the second mask layer 142 may be removed. However, due to the presence of the first etch stop layer 161_1, while the first preliminary hole pattern 140P1 penetrates or extends through the first mask layer 141 in the first cell area CA1, the second preliminary hole pattern 140P2 does not extend through the first mask layer 141 in the second cell area CA2.

In addition, due to the presence of the first etch stop layer 161_1, a height difference in the Z direction may occur in the first mask layer 141 between the first cell area CA1 and the second cell area CA2. A top surface of the first cell area CA1 may be lower than a top surface of the second cell area CA2 as shown in FIG. 8.

Figure 9:
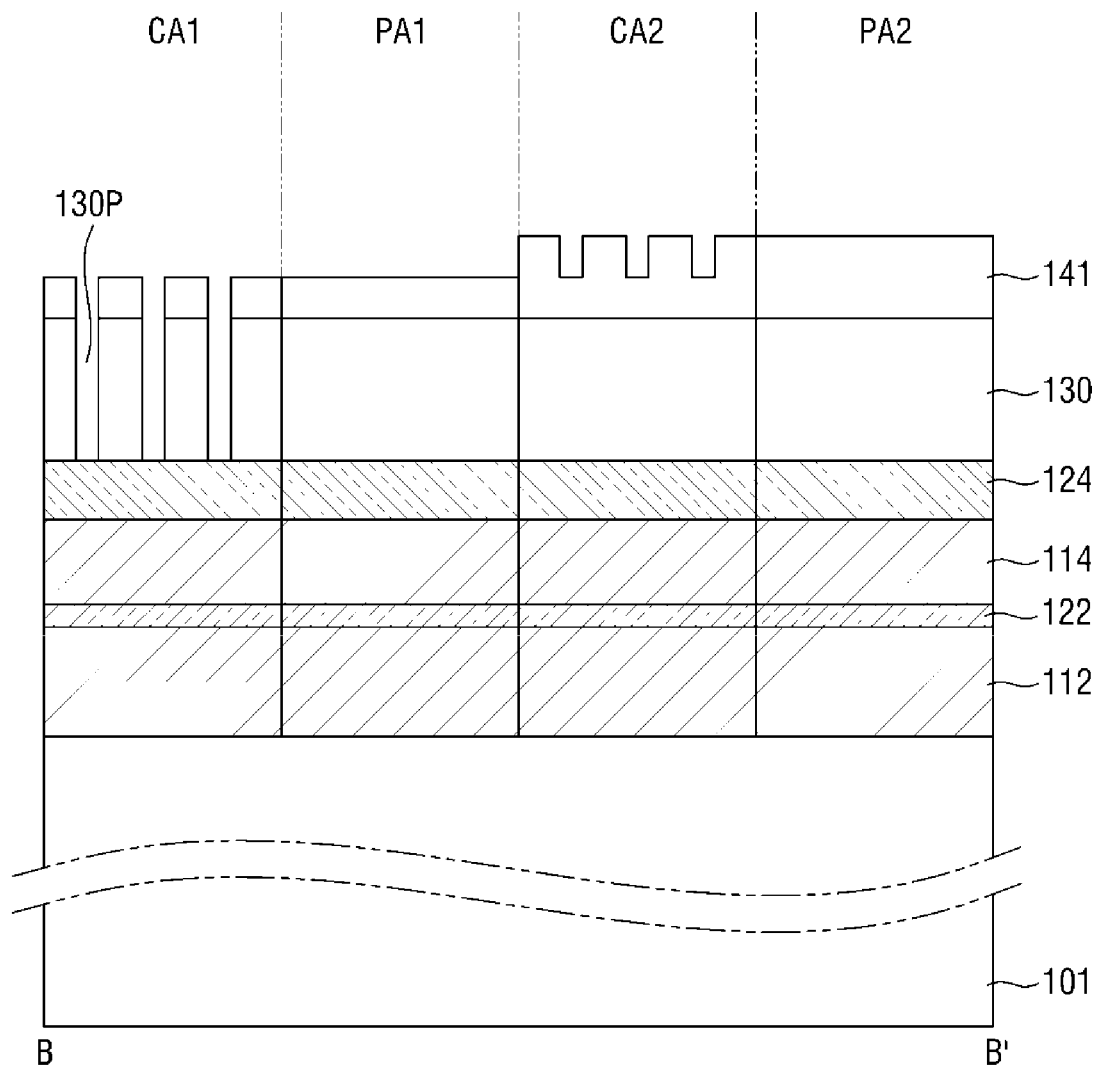

Referring to FIGS. 8 and 9, using the first preliminary hole pattern 140P1 positioned in the first cell area CA1 and the second preliminary hole pattern 140P2 positioned in the second cell area CA2 as etching mask patterns, the carbon-containing layer 130 in the first cell area CA1 may be etched through to form the carbon-containing layer pattern 130P.

Due to a difference in etching selectivity between the first mask layer 141 and the carbon-containing layer 130, while the carbon-containing layer 130 is penetrated or etched through in the first cell area CA1, the second preliminary hole pattern 140P2 in the second cell area CA2 may not penetrate through or extend through the first mask layer 141.

However, embodiments of the present inventive concept are not limited thereto, and although not illustrated, a portion of the carbon-containing layer 130 may be etched in the second cell area CA2 in the above-described process operation.

Figure 10:
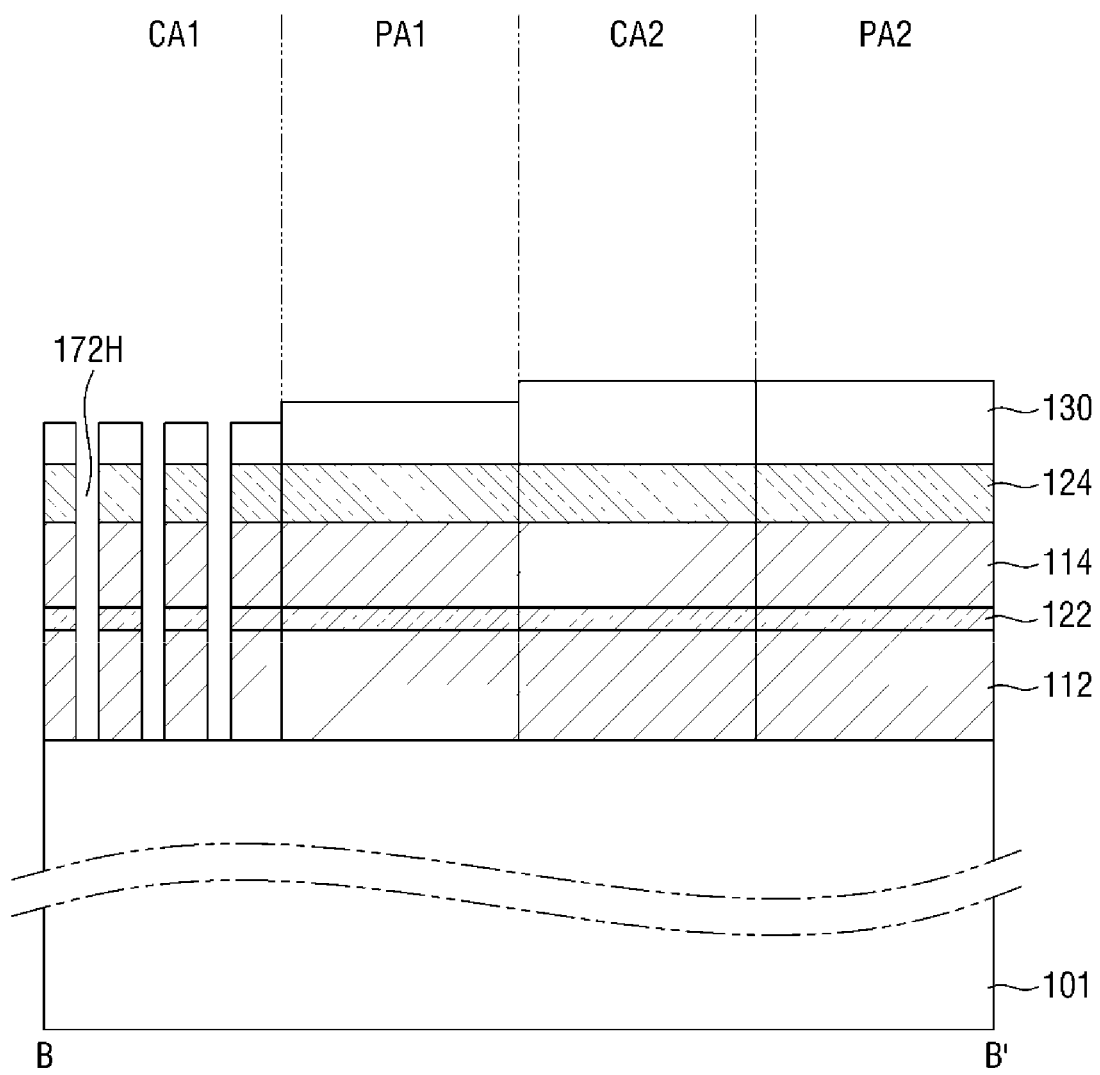

Referring to FIG. 10, using the carbon-containing layer pattern 130P as an etching mask pattern, the first mold layer 112, the first supporter layer 122, the second mold layer 114 and the second supporter layer 124 may be etched in the first cell area CA1 to form a capacitor hole pattern 172H in the first cell area CA1.

During the process of forming the capacitor hole pattern 172H, a portion of the carbon-containing layer 130 and the first mask layer 141 may be removed, and a height difference in the Z direction may occur in the carbon-containing layer 130 due to the height difference formed in FIG. 8 and the difference in etching selectivity between the first mask layer 141 and the carbon-containing layer 130.

A top surface of the first cell area CA1 may be lower in the Z direction than top surfaces of the first peripheral area PA1 and the second cell area CA2, and the top surface of the first peripheral area PA1 may be lower in the Z direction than the top surface of the second cell area CA2.

Figure 11:
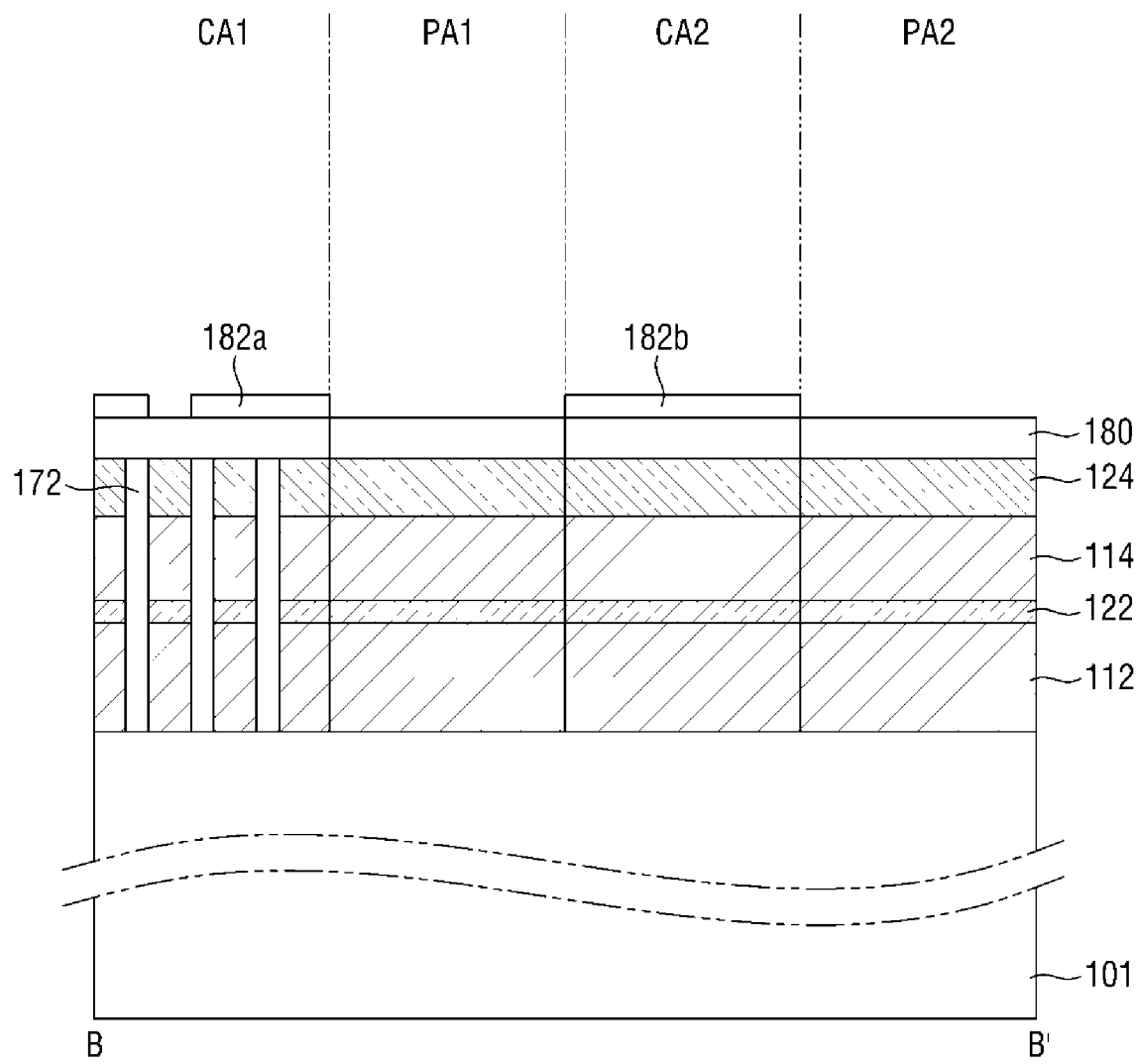

Before the operation of FIG. 11, an ashing and stripping process may be performed on the carbon-containing layer 130 remaining on the second supporter layer 124.

Referring to FIG. 11, the plurality of lower electrodes 172 in the capacitor hole pattern 172H may be formed. Thereafter, a supporter mask layer 180 and first and second supporter pattern layers 182a and 182b may be formed sequentially on upper surfaces of the second supporter layer 124 and the lower electrodes 172 in the first and second cell areas CA1 and CA2 and the first and second peripheral areas PA1 and PA2.

The first and second supporter pattern layers 182a may include a photoresist, and according to some embodiments, the preliminary pattern layer 160 may include a carbon compound. However, embodiments of the present inventive concept are not limited thereto.

The supporter mask layer 180 may include silicon oxide or a spin-on hardmask (SOH) in some embodiments, but embodiments of the inventive concept are not limited thereto.

The first supporter pattern layer 182a is disposed on the supporter mask layer 180 in the first cell area CA1. The first supporter pattern layer 182a may have a shape of lines parallel to each other, a shape of bars parallel to each other, a square shape, or a circle shape in a plan view, but embodiments of the inventive concept are not limited thereto. Accordingly, a portion of the supporter mask layer 180 may be exposed in the first cell area CA1.

In the drawing, the portion of the supporter mask layer 180 exposed by the first supporter pattern layer 182a and the lower electrode 172 do not overlap each other in a plan view, but may at least partially overlap each other according to other embodiments of the inventive concept.

The second supporter pattern layer 182b may be on and entirely cover the supporter mask layer 180 in the second cell area CA2 in the Z direction.

Figure 12:
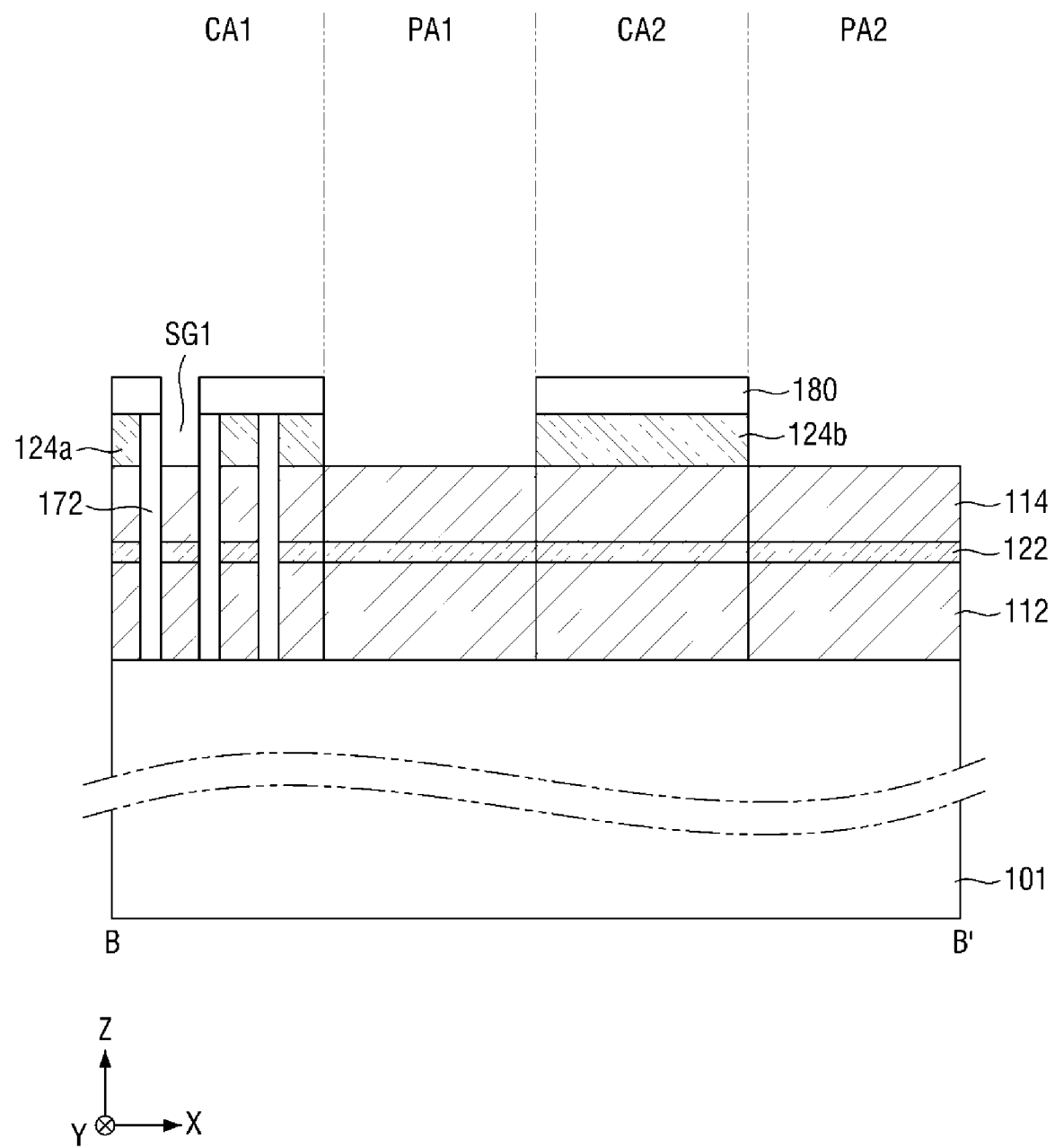

Referring to FIG. 12, the supporter mask layer 180 may be etched along the first and second supporter pattern layers 182a and 182b to form a supporter mask pattern. A portion of the second supporter layer 124 under the supporter mask pattern may be removed to form a supporter opening SG1 along sidewalls of the second supporter 124a and the supporter mask pattern.

A plurality of supporter openings SG1 may be formed in the first cell area CA1 according to some embodiments of the inventive concept.

Figure 13:
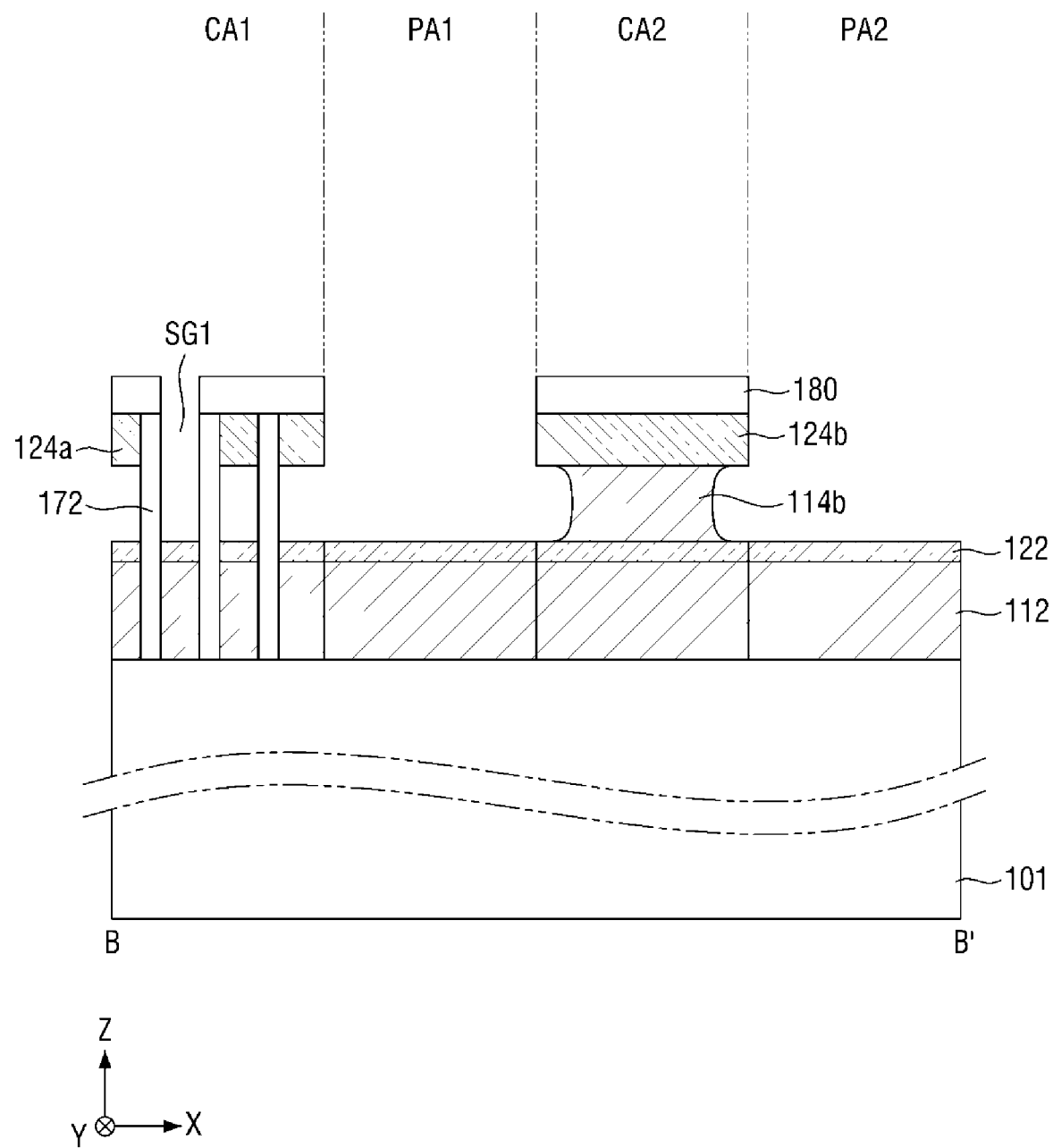

Referring to FIG. 13, the second mold layer 114 (see FIG. 12) positioned in the first cell area CA1 and the first and second peripheral areas PA1 and PA2 may be removed to expose the first supporter layer 122. The removal of the second mold layer 114 (see FIG. 12) located in the first cell area CA1 and the first and second peripheral areas PA1 and PA2 may be performed through a lift-off process using a limulus amoebocyte lysate (LAL), a wet etching process, an ashing and stripping process, or the like.

During the removal process of the second mold layer 114 (see FIG. 12) positioned in the first cell area CA1 and the first and second peripheral areas PA1 and PA2, the second mold film 114b positioned in the second cell area CA2 may not be removed due to being covered by the second supporter film 124b. However, according to an embodiment, as shown in FIG. 13, a portion of a sidewall of the second mold film 114b positioned in the second cell area CA2 is removed, so that the sidewall of the second mold film 114b may be formed concavely.

Figure 14:
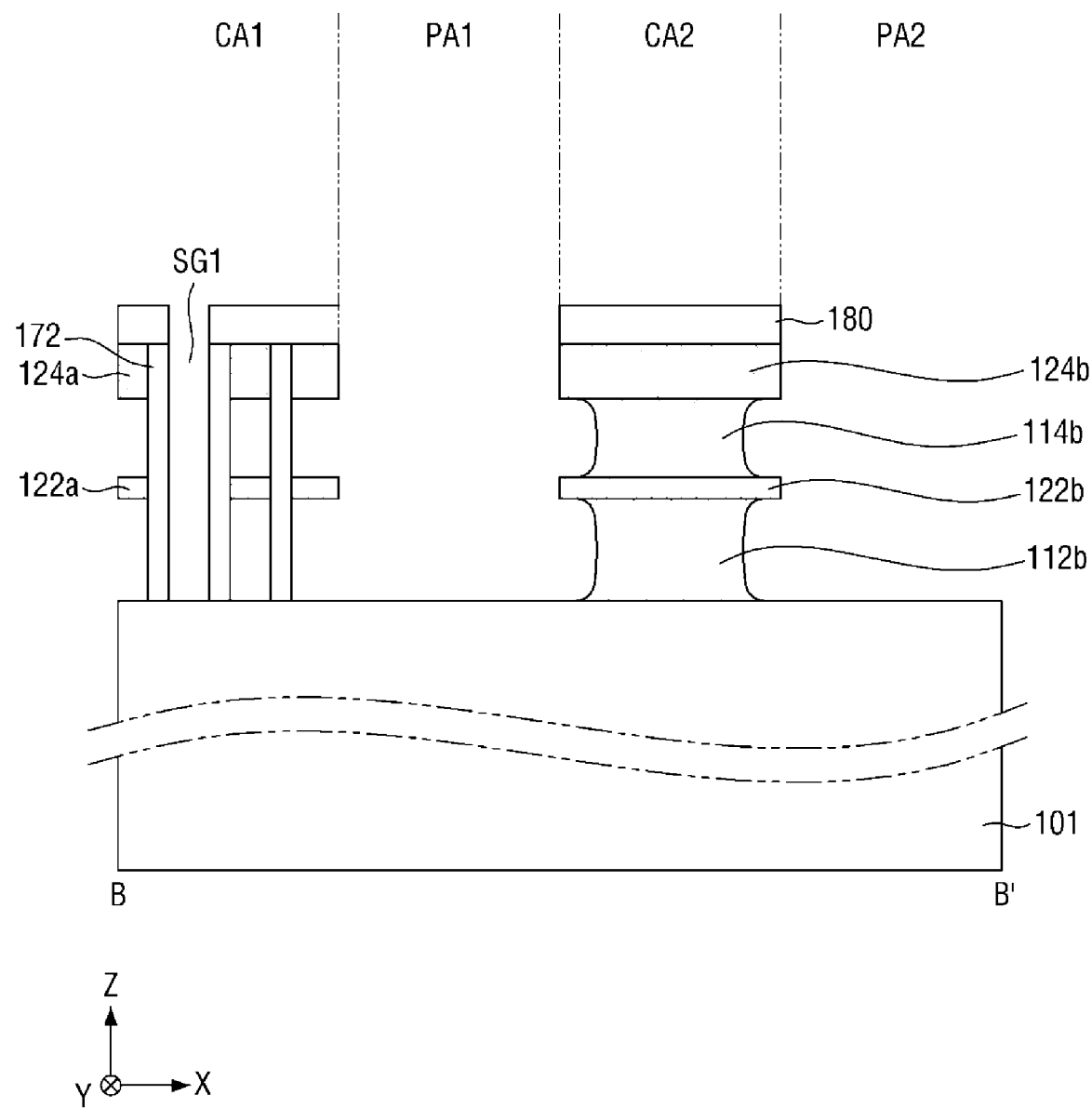

Referring to FIGS. 13 and 14, a portion of the first supporter layer 122 in the supporter opening SG1 may be removed to form the first supporter 122a and the first supporter film 122b. Further, the first mold layer 112 may be removed.

In addition, as a portion of the second supporter layer 124 is removed in FIG. 12, a portion of the first supporter layer 122 may be removed through patterning according to some embodiments of the inventive concept.

Then, as the second mold layer 114 is removed and the second mold film 114b is formed in FIG. 13, the first mold layer 112 may be removed and the first mold film 112b may be formed.

Figure 15:
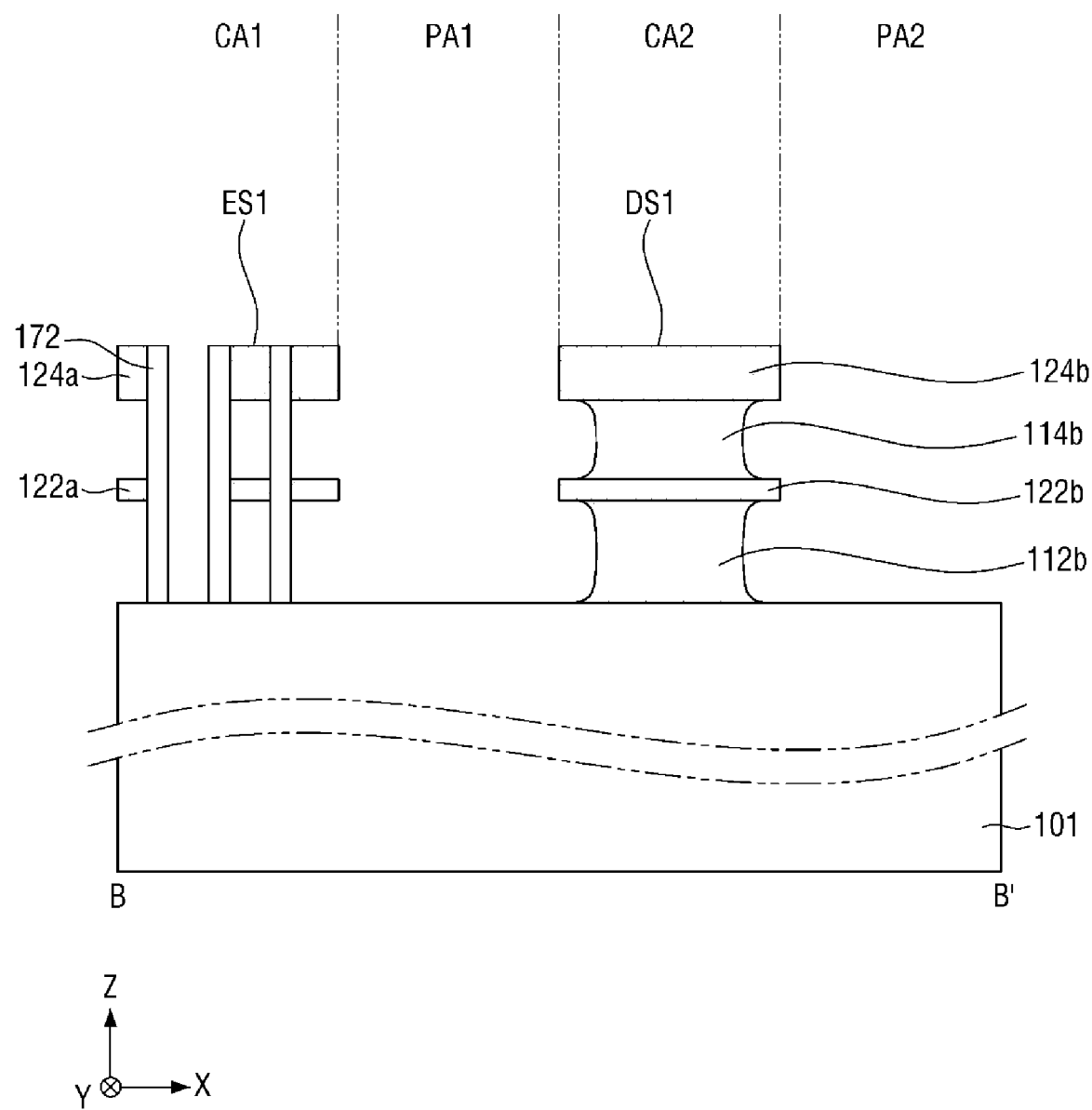

Referring to FIG. 15, the supporter mask layer 180 remaining on upper surfaces of the second supporter 124a, the second supporter film 124b, and the lower electrode 172 may be removed to form the lower electrode structure ES1 and the dummy structure DS1.

The removal of the remaining supporter mask layer 180 may be performed through a dry etching process, a wet etching process, or an ashing and stripping process, but embodiments of the present inventive concept are not limited thereto.

Figure 16:
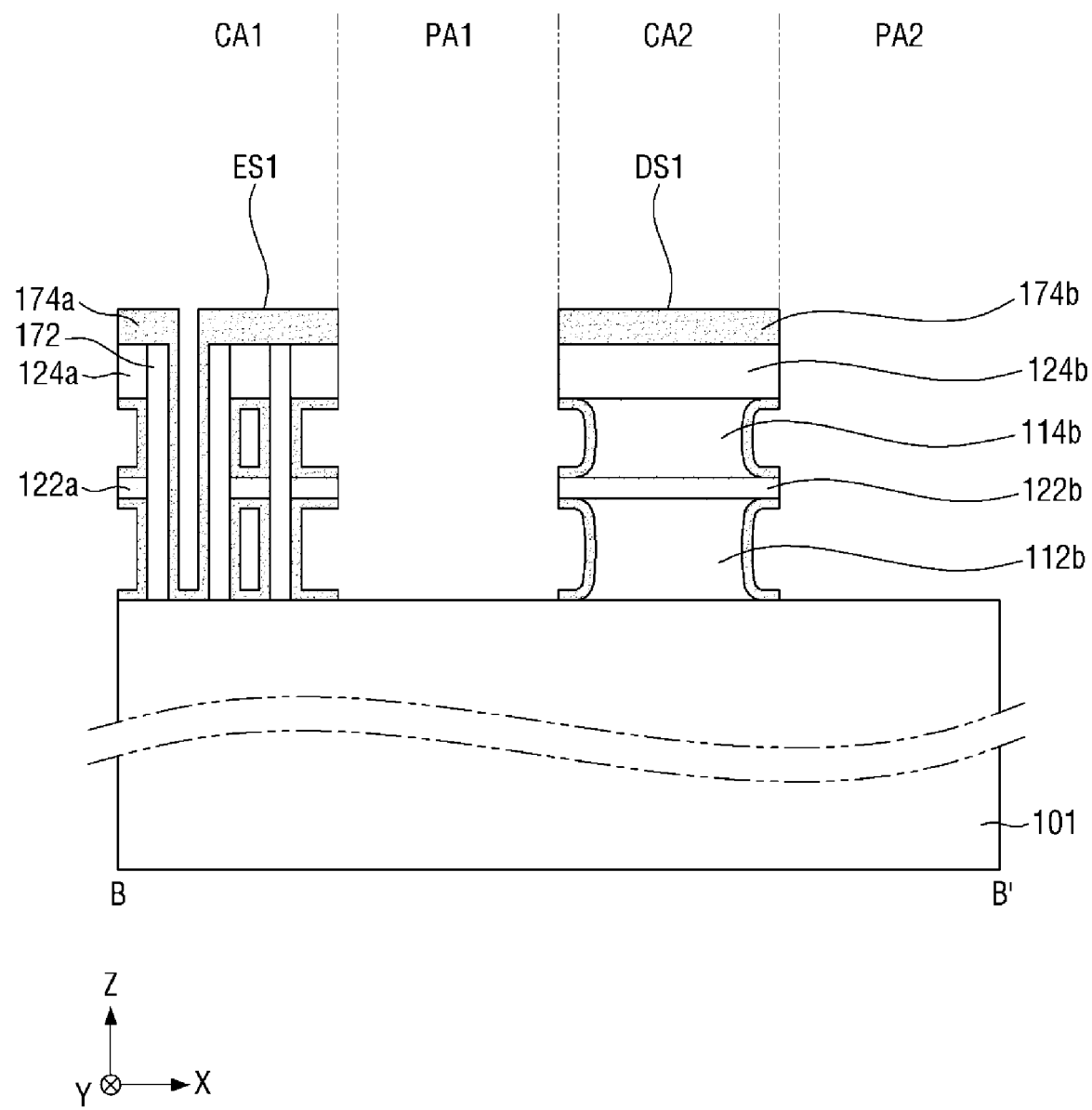
Figure 17:
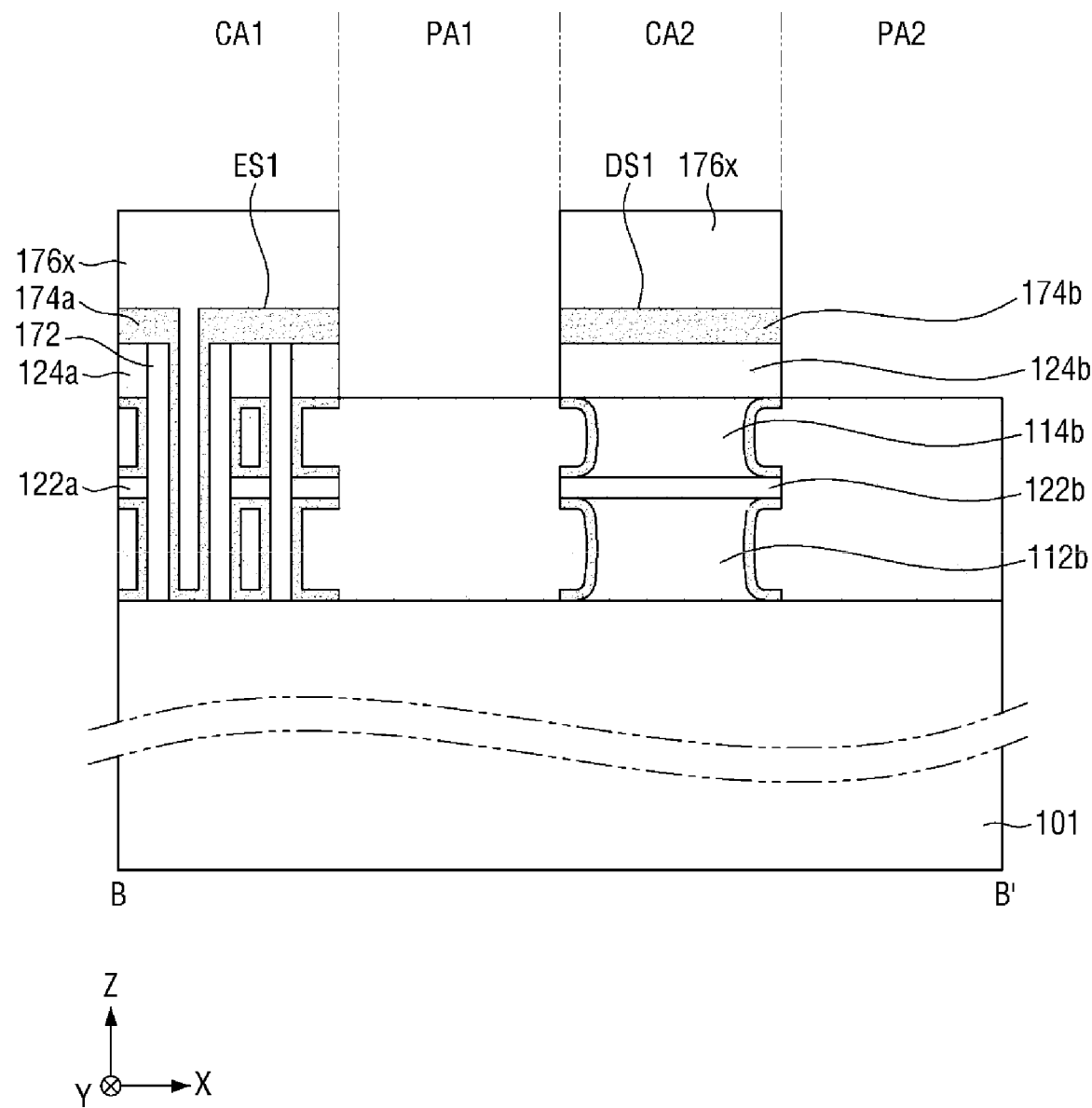

Referring to FIGS. 16 and 17, the dielectric films 174a and 174b and an upper electrode material 176x may be sequentially formed to be on and at least partially cover the first and second cell areas CA1 and CA2 and the first and second peripheral areas PA1 and PA2.

In FIG. 16, the same material is not used to form the dielectric films 174a and 174b in the first and second peripheral areas PA1 and PA2, but embodiments of the inventive concept are not limited thereto. According to some embodiments, the dielectric films 174a and 174b and the upper electrode material 176x may be formed sequentially in the first and second peripheral areas PA1 and PA2.

In some embodiments, the dielectric films 174a and 174b may include, for example, silicon oxide or a high-k material. The upper electrode material 176x may include, for example, one or more of titanium, titanium nitride, tantalum nitride, platinum, tungsten, doped polysilicon, doped silicon germanium, and the like.

The upper electrode material 176x may be formed by, for example, a PVD process, a CVD process, a MOCVD process, an ALD process, or a MOALD process, but embodiments of the inventive concept are not limited thereto. In addition, as illustrated in FIG. 17, when sidewalls of the first and second mold films 112b and 114b are concave according to some embodiments, the upper electrode material 176x may be at least partially filled therein.

Figure 18:
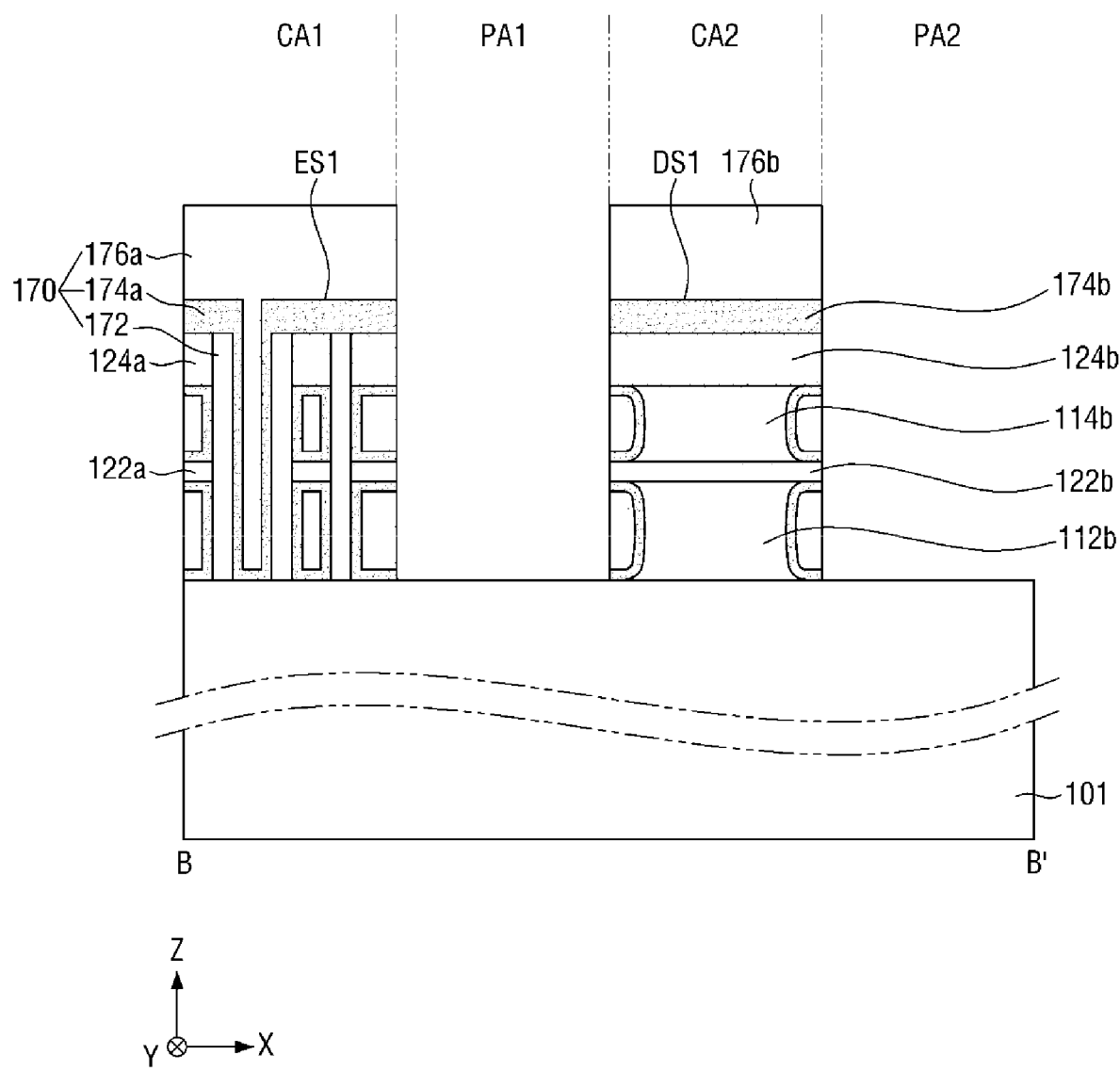

Referring to FIG. 18, a dielectric film (not shown) and the upper electrode material 176x positioned in the first and second peripheral areas PA1 and PA2 may be removed by performing a removal process, thereby forming the dielectric film 174a and the upper electrode 176a positioned in the first cell area CA1 and the dielectric film 174b and the upper electrode 176b positioned in the second cell area CA2. Accordingly, the first and second cell areas CA1 and CA2 may be electrically insulated.

Although not illustrated, the removal process may include, after forming a cell close mask layer (not shown) on and at least partially covering the first and second cell areas CA1 and CA2, performing an anisotropic etching process using the cell close mask layer as an etching mask. However, embodiments of the present inventive concept are not limited thereto.

Figure 19:
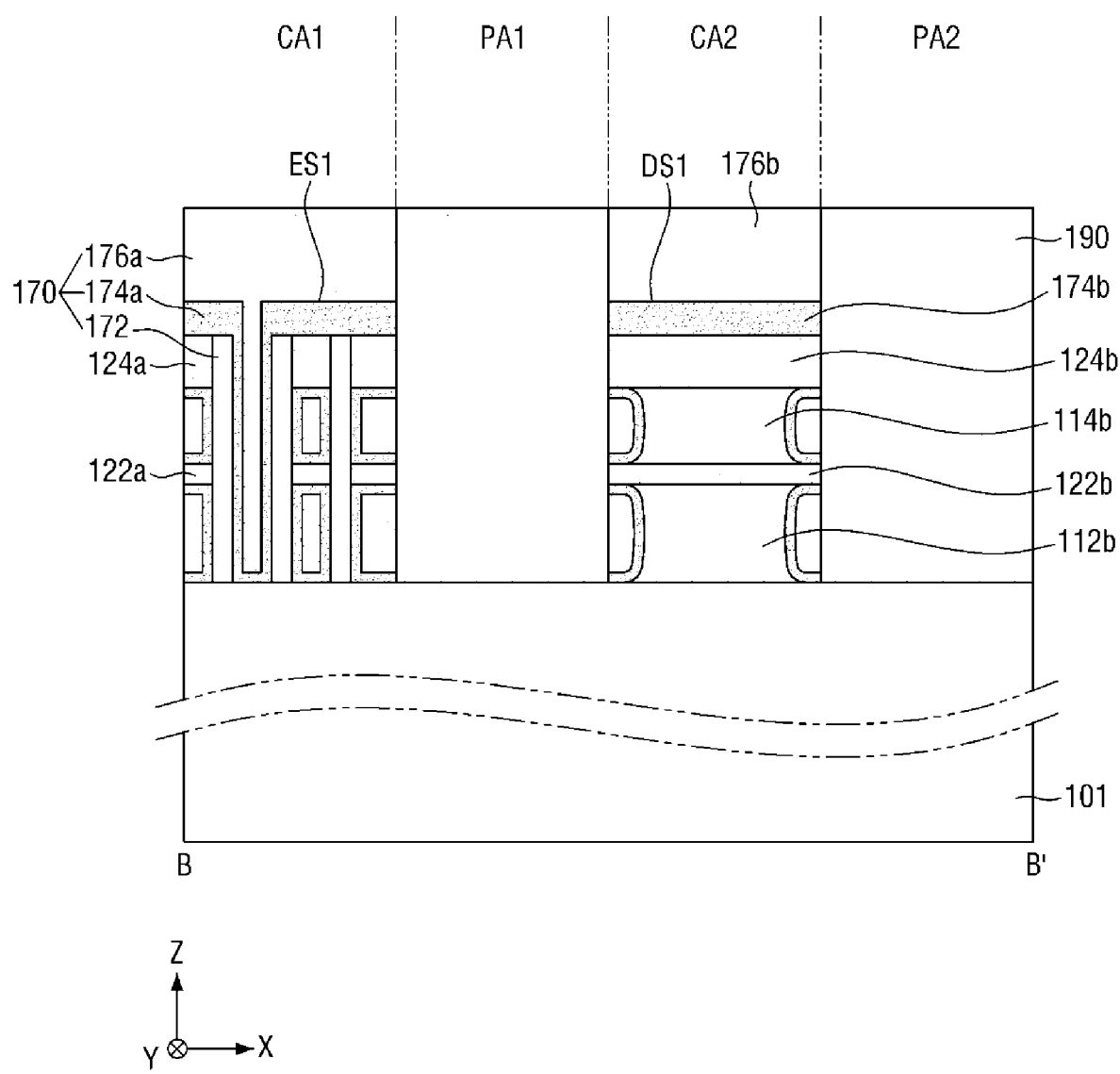

Referring to FIG. 19, the interlayer insulating film 190 on and at least partially covering the first and second peripheral areas PA1 and PA2 may be formed and subjected to a planarization (CMP) process. In some embodiments, the interlayer insulating film 190 may be formed to be on and at least partially cover the first and second cell areas CA1 and CA2 as well as the first and second peripheral areas PA1 and PA2.

The interlayer insulating film 190 may include, for example, silicon oxide, but embodiments of the inventive concept are not limited thereto.

Figure 20:
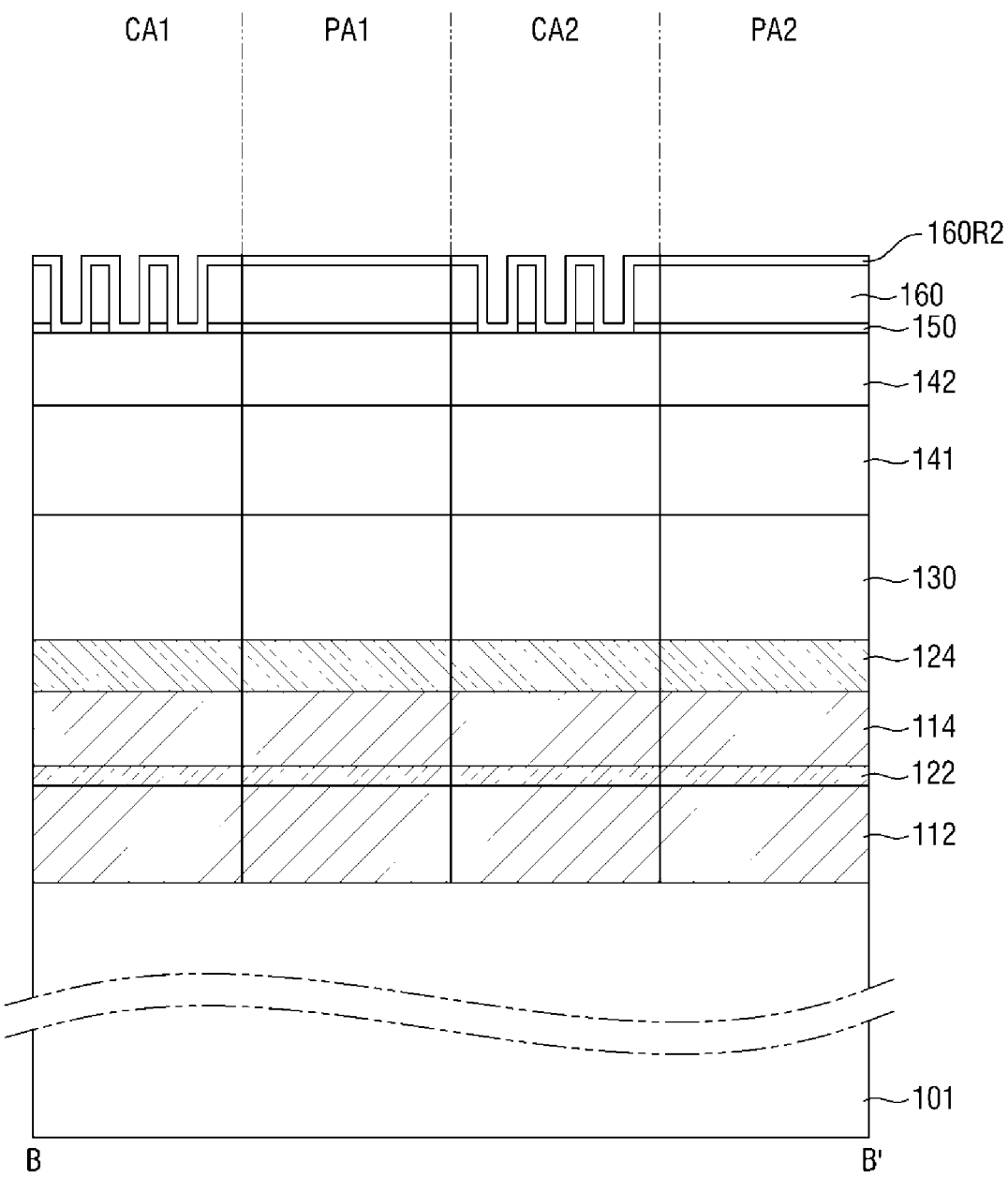
FIGS. 20 and 21 are diagrams showing the intermediate steps of a method of manufacturing a semiconductor device according to some other embodiments of the present inventive concept.
Figure 21:
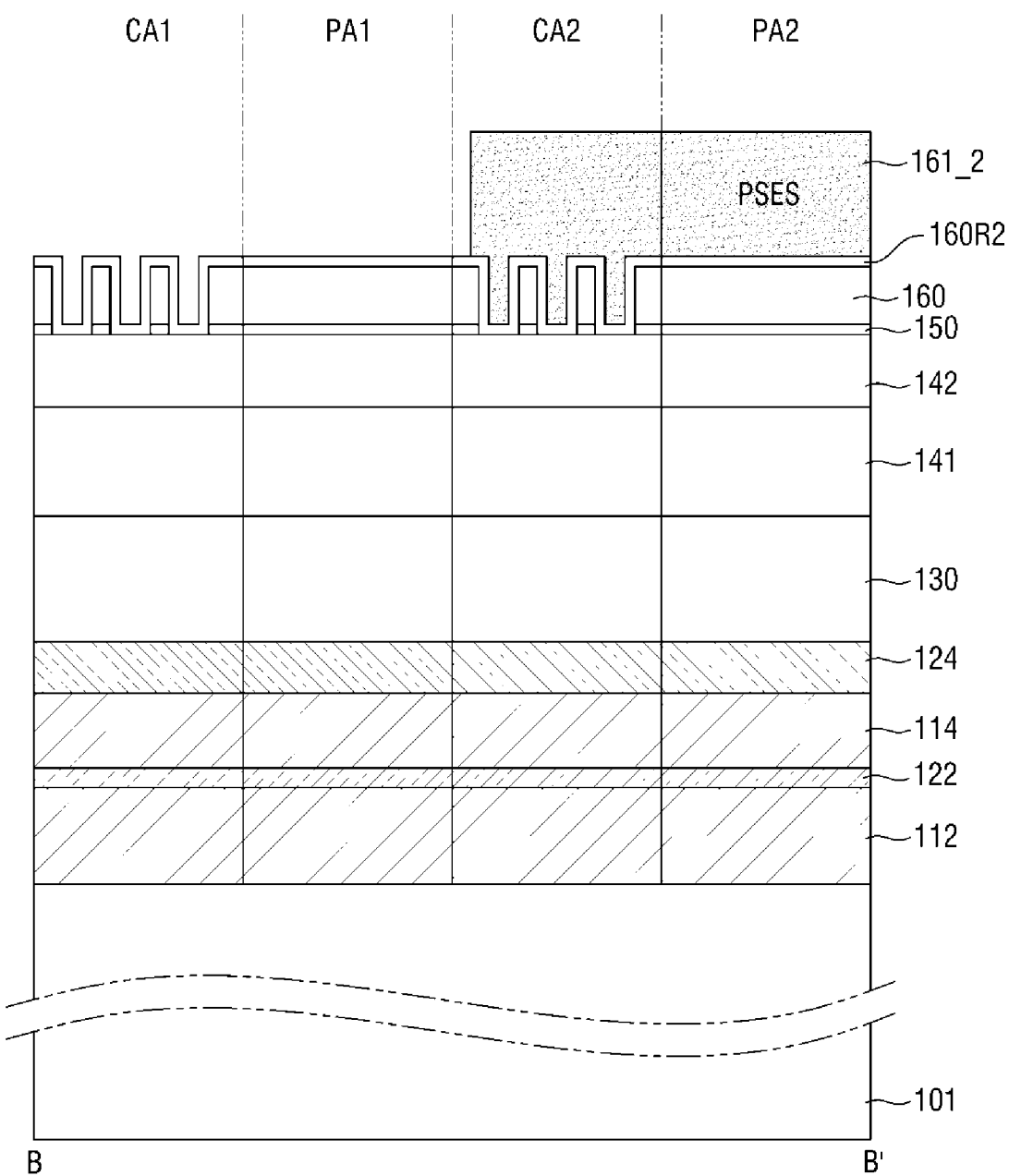

FIGS. 20 and 21 are diagrams showing the intermediate steps of a method of manufacturing a semiconductor device according to some other embodiments of the present inventive concept.

The description of FIGS. 20 and 21 will focus on differences from the description of the embodiments of FIGS. 6 and 7. In the drawings, the same components are denoted by the same reference numerals, and a redundant description thereof will be omitted.

Before the step of FIG. 20, the process steps of FIGS. 4 and 5 are performed. Referring to FIG. 20, a portion of the ARC layer 150 may be etched along the first and second patterns P1 and P2 to expose an upper surface of the second mask layer 142. Further, a second rework layer 160R2 may be formed along an upper surface of the pattern layer 160, a sidewall of the ARC layer 150, and an upper surface of the second mask layer 142.

The second rework layer 160R2 may include the same material as the first rework layer 160R1 of FIG. 6, but may be different from the first rework layer 160R1 in that it physically contacts the upper surface of the second mask layer 142.

Referring to FIG. 21, a second etch stop layer 161_2 may be formed on the second rework layer 160R2 in the second cell area CA2 and the second peripheral area PA2. The second etch stop layer 161_2 may include the same material as the first etch stop layer 161_1 of FIG. 7, but may be different from the first etch-stop layer 161_1 in that it is disposed on the second rework layer 160R2. Thereafter, the processes of FIGS. 8 to 19 are performed.

Figure 22:
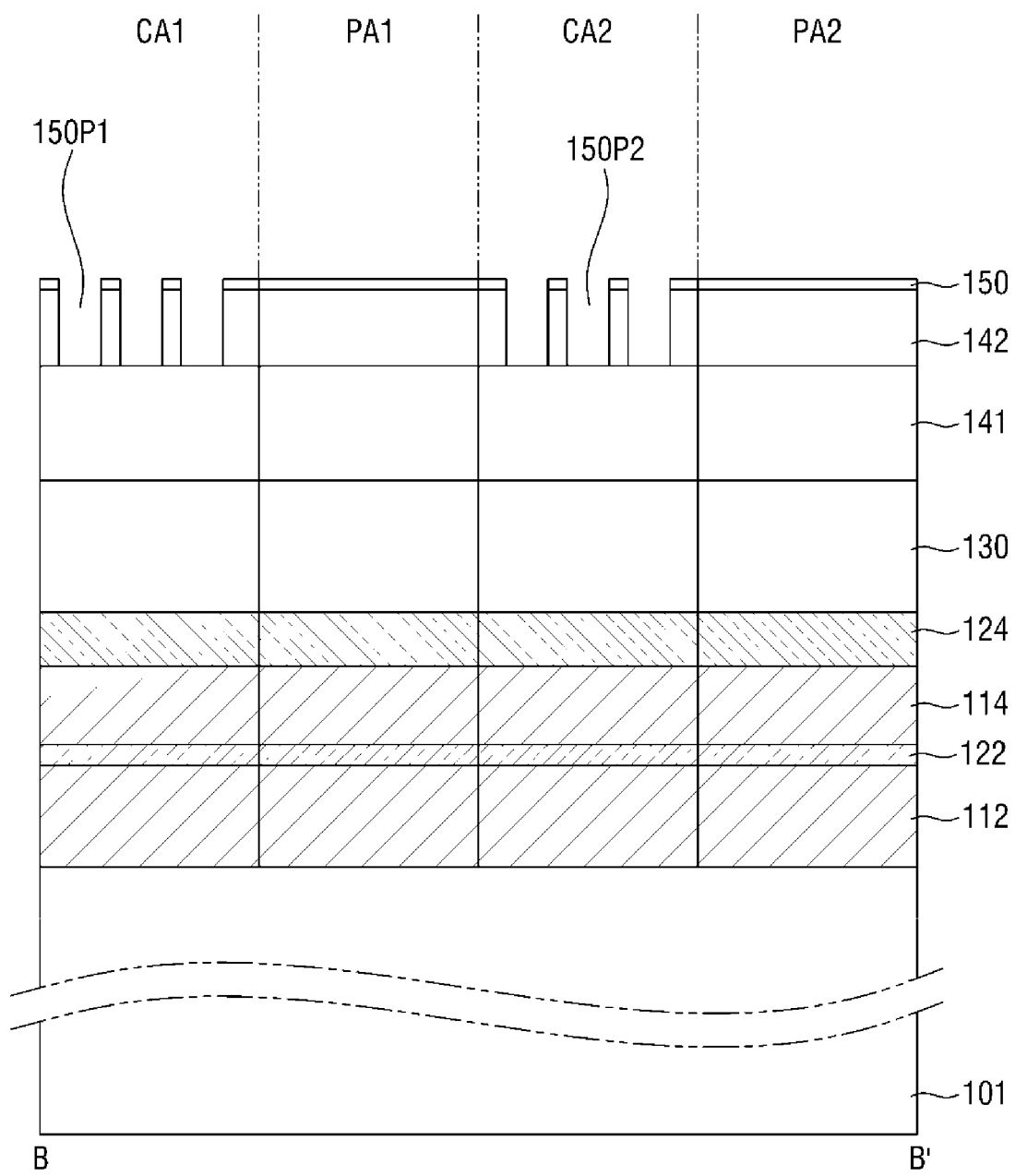
FIGS. 22 and 23 are diagrams showing the intermediate steps of a method of manufacturing a semiconductor device according to some other embodiments of the present inventive concept.
Figure 23:
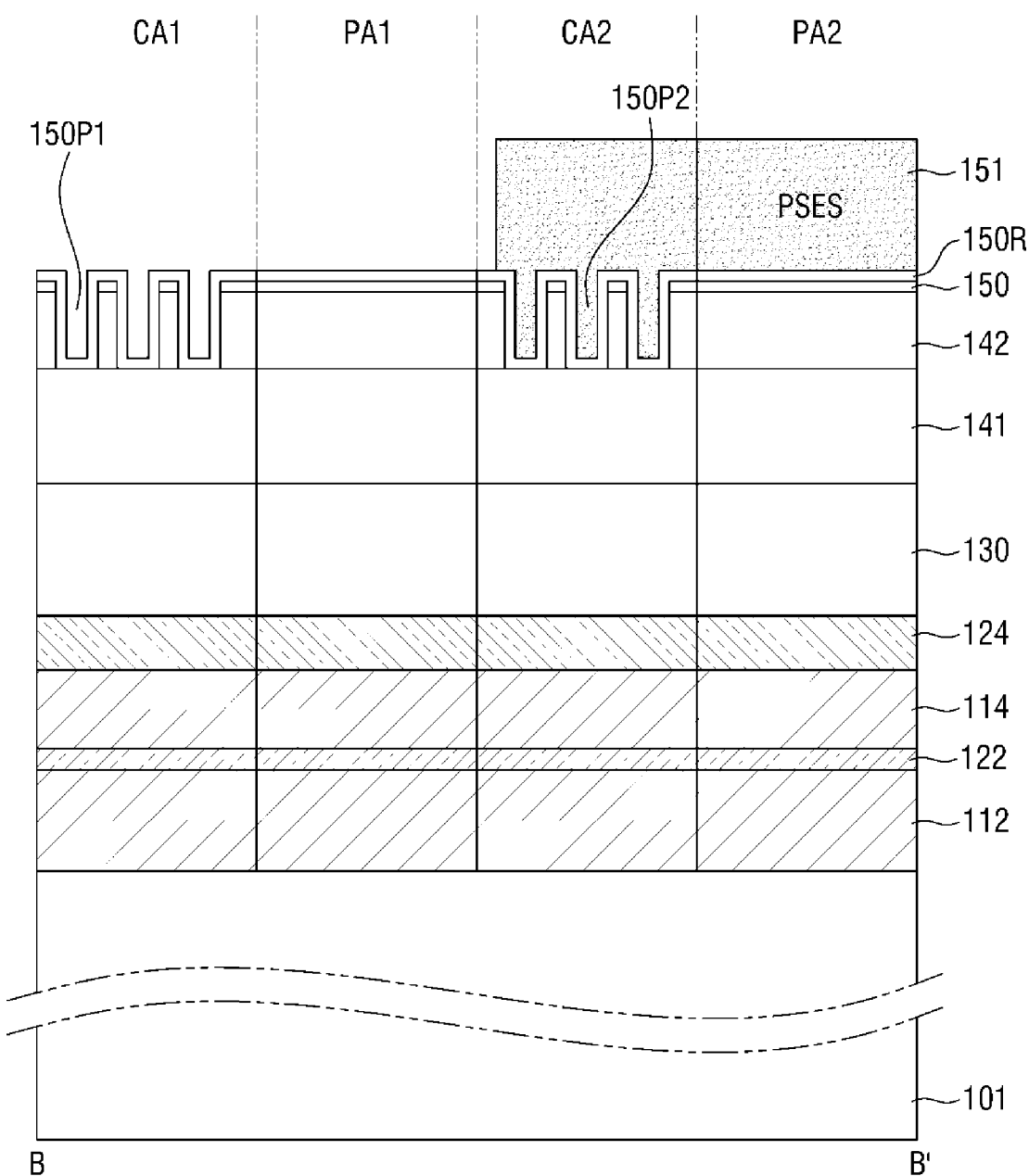

FIGS. 22 and 23 are diagrams showing the intermediate steps of a method of manufacturing a semiconductor device according to some other embodiments of the present inventive concept.

The description of FIGS. 22 and 23 will focus on differences from the description of the embodiments of FIGS. 6 and 7. In the drawings, the same components are denoted by the same reference numerals, and a redundant description thereof will be omitted.

Before the operation of FIG. 22, the process operations of FIGS. 4 and 5 are performed. Referring to FIGS. 22 and 23, a portion of the ARC layer 150 and a portion of the second mask layer 142 are etched along the first and second patterns P1 and P2 to expose an upper surface of the first mask layer 141, and, thus, first and second mask patterns 150P1 and 150P2 may be formed.

In the process of forming the first and second mask patterns 150P1 and 150P2, the pattern layer 160 and a portion of the ARC layer 150 may be removed to expose an upper surface of the ARC layer 150.

A third rework layer 150R may be formed along the upper surface of the ARC layer 150, a sidewall of the second mask layer 142, and the upper surface of the first mask layer 141. The third rework layer 150R may include the same material as the first rework layer 160R1 of FIG. 6, but may be different from the first rework layer 160R1 in that it physically contacts the upper surface of the first mask layer 141.

Thereafter, a third etch stop layer 151 may be formed on the third rework layer 150R in the second cell area CA2 and the second peripheral area PA2. The third etch stop layer 151 may include the same material as the first etch stop layer 161_1 of FIG. 7, but may be different from the first etch stop layer 161_1 in that it is disposed on the third rework layer 150R. Thereafter, the process operations of FIGS. 8 to 19 are performed.

When performing a semiconductor device manufacturing method according to some embodiments of the inventive concept, after the first pattern P1 and the second pattern P2 are formed in the pattern layer 160, the first to third etch stop layers 161_1, 161_2, and 151 are formed. Therefore, a height difference may not occur in the first cell area CA1, and, thus, pattern defects can be reduced or prevented when the hole pattern 172H is formed at the edge of the first cell area CA1.

Further, when the first to third etch stop layers 161_1, 161_2 and 151 are formed and then the first pattern P1 and the second pattern P2 are formed in the pattern layer 160 without causing a height difference, a process operation, such as generating a stepped portion in the carbon-containing layer 130 may be added, and, accordingly, cost may increase.

Furthermore, because the second pattern P2 may serve as an alignment key pattern, when the first to third etch stop layers 161_1, 161_2 and 151 are formed after the first pattern P1 and the second pattern P2 are formed, the first to third etch stop layers 161_1, 161_2 and 151 may be formed at a target point without adding a process for the alignment key pattern.

However, the effects of the embodiments are not restricted to the one set forth herein. The above and other effects of the embodiments will become more apparent to one of daily skill in the art to which the present disclosure pertains by referencing the claims.

What is claimed is:

1. A method of manufacturing a semiconductor device, comprising:
providing a substrate in which a main area including a first cell area and a first peripheral area, and an edge area including a second cell area and a second peripheral area are defined;
sequentially forming a mold layer, a supporter layer, a mask layer and a preliminary pattern layer on the substrate;
exposing the preliminary pattern layer to light to simultaneously form a first pattern and a second pattern on the mask layer of the first cell area and the second cell area, respectively;
forming an etch stop layer on the second pattern; and
etching the mask layer using the etch stop layer and the first pattern to form a hole pattern in the mold layer and the supporter layer of the first cell area.

2. The method of claim 1, wherein a height between the substrate and a highest point of the first pattern is equal to a height between the substrate and a highest point of the second pattern.

3. The method of claim 1, wherein the etch stop layer is not formed on the main area.

4. The method of claim 1, wherein the first pattern and the second pattern are formed using extreme ultraviolet (EUV) light.

5. The method of claim 1, further comprising:
forming an anti-reflective coating layer between the preliminary pattern layer and the mask layer.

6. The method of claim 1, wherein the forming the hole pattern comprises:
forming a mask pattern on the mask layer using the etch stop layer and the first pattern; and
etching the mold layer and the supporter layer using the mask pattern.

7. The method of claim 6, wherein the mask pattern includes a first preliminary hole pattern formed in the first cell area, and a second preliminary hole pattern formed in the second cell area, wherein the first preliminary hole pattern extends through the mask pattern, and wherein the second preliminary hole pattern does not extend through the mask pattern.

8. The method of claim 1, further comprising:

before forming the etch stop layer, forming a rework layer on the first pattern and the second pattern.

9. The method of claim 8, further comprising:

forming an anti-reflective coating layer between the preliminary pattern layer and the mask layer; and before forming the rework layer, etching the anti-reflective coating layer along sides of the first pattern and the second pattern.

10. The method of claim 9, wherein the mask layer includes a first mask layer and a second mask layer on the first mask layer, and wherein the etch stop layer and the second mask layer include the same material.

11. The method of claim 8, wherein the mask layer includes a first mask layer and a second mask layer on the first mask layer, the method further comprising:

forming an anti-reflective coating layer between the preliminary pattern layer and the mask layer; and before forming the rework layer, etching the anti-reflective coating layer along sides of the first pattern and the second pattern.

12. A method of manufacturing a semiconductor device, comprising:

providing a substrate in which a main area including a first cell area and a first peripheral area, and an edge area including a second cell area and a second peripheral area are defined;

sequentially forming a mold layer, a supporter layer, a mask layer, an anti-reflective coating layer, and a preliminary pattern layer on the substrate;

exposing the preliminary pattern layer to light to form a first pattern and a second pattern on the anti-reflective coating layer of the first cell area and the second cell area, respectively;

forming an etch stop layer on the second pattern, the etch stop layer not being formed on the main area; and etching the mask layer using the etch stop layer and the first pattern to form a hole pattern in the mold layer and the supporter layer of the first cell area.

13. The method of claim 12, wherein the first pattern and the second pattern are formed simultaneously.

14. The method of claim 12, further comprising:

etching the anti-reflective coating layer along sides of the first pattern and the second pattern; and before forming the etch stop layer, forming a rework layer on the first pattern and the second pattern.

15. The method of claim 12, wherein the forming the hole pattern comprises:

forming a first mask pattern on the mask layer using the etch stop layer and the first pattern; and etching the mold layer and the supporter layer through the first mask pattern in the first cell area.

16. The method of claim 15, wherein a second mask pattern is formed on the mask layer using the etch stop layer and the second pattern in the second cell area, and wherein the second mask pattern does not extend through the mask layer.

17. A method of manufacturing a semiconductor device, comprising:

providing a substrate in which a main area including a first cell area and a first peripheral area, and an edge area including a second cell area and a second peripheral area are defined;

sequentially forming a mold layer, a supporter layer, a mask layer, an anti-reflective coating layer, and a preliminary pattern layer on the substrate;

exposing the preliminary pattern layer to light to simultaneously form a first pattern and a second pattern on the anti-reflective coating layer of the first cell area and the second cell area, respectively;

forming an etch stop layer on the second pattern, the etch stop layer not being formed on the main area;

forming a hole pattern in the first cell area using the etch stop layer and the first pattern to extend through the mold layer, the supporter layer and the mask layer, the hole pattern not being formed on the first peripheral area, the second cell area and the second peripheral area, forming a lower electrode in the hole pattern;

exposing an upper surface of the supporter layer, such that upper ends of the supporter layer on the first cell area, an upper end of the supporter layer on the first peripheral area, an upper end of the supporter layer on the second cell area, and an upper end of the supporter layer on the second peripheral area are at substantially a same level;

forming a supporter mask layer on the supporter layer;

patterning the supporter mask layer to form a supporter mask pattern;

forming a supporter opening using the supporter mask pattern to extend through the supporter layer;

removing the mold layer;

forming a capacitor dielectric layer on the lower electrode;

forming an upper electrode on the capacitor dielectric layer;

forming an interlayer insulating layer on the upper electrode; and planarizing the interlayer insulating layer.

18. The method of claim 17, wherein a height between the substrate and a highest point of the first pattern is equal to a height between the substrate and a highest point of the second pattern.

19. The method of claim 17, wherein the first pattern and the second pattern are formed using extreme ultraviolet (EUV) light.

20. The method of claim 17, wherein the mask layer includes a first mask layer and a second mask layer on the first mask layer, the method further comprising:

etching the anti-reflective coating layer and the second mask layer along sides of the first pattern and the second pattern; and before forming the etch stop layer, forming a rework layer on the first pattern and the second pattern.

* * * * *